US011410992B2

(12) United States Patent
Fulford et al.

(10) Patent No.: US 11,410,992 B2
(45) Date of Patent: Aug. 9, 2022

(54) 3D SEMICONDUCTOR APPARATUS MANUFACTURED WITH A CANTILEVER STRUCTURE AND METHOD OF MANUFACTURE THEREOF

(71) Applicant: TOKYO ELECTRON LIMITED, Tokyo (JP)

(72) Inventors: H. Jim Fulford, Marianna, FL (US); Mark I. Gardner, Cedar Creek, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 56 days.

(21) Appl. No.: 17/124,053

(22) Filed: Dec. 16, 2020

(65) Prior Publication Data
US 2022/0005805 A1    Jan. 6, 2022

Related U.S. Application Data

(60) Provisional application No. 63/046,929, filed on Jul. 1, 2020.

(51) Int. Cl.
*H01L 27/06* (2006.01)
*H01L 27/092* (2006.01)
*H01L 21/8238* (2006.01)

(52) U.S. Cl.
CPC .. *H01L 27/0688* (2013.01); *H01L 21/823807* (2013.01); *H01L 21/823821* (2013.01); *H01L 21/823828* (2013.01); *H01L 21/823857* (2013.01); *H01L 21/823878* (2013.01); *H01L 27/0924* (2013.01)

(58) Field of Classification Search
CPC ......... H01L 27/0688; H01L 21/823821; H01L 21/823828; H01L 21/823857; H01L 21/823878; H01L 27/0924; H01L 27/092; H01L 21/8221; H01L 21/823885
See application file for complete search history.

(56) References Cited

U.S. PATENT DOCUMENTS

2020/0235121 A1* 7/2020 Liu .................. H01L 29/401

* cited by examiner

*Primary Examiner* — Karen Kusumakar
*Assistant Examiner* — Adam S Bowen
(74) *Attorney, Agent, or Firm* — Oblon, McClelland, Maier & Neustadt, L.L.P.

(57) ABSTRACT

Aspects of the disclosure provide a method of forming a semiconductor apparatus. A stack of dielectric layers is formed over a semiconductor layer on a substrate of the semiconductor apparatus. Multiple openings are formed in the stack of dielectric layers. Multiple pillars including first sub-pillars and second sub-pillars are formed in the multiple openings. A cantilever structure that includes a first cantilever beam and a second cantilever beam is formed. A cantilever supporting structure that includes a portion of a first subset of the multiple pillars is formed. The first cantilever beam connects the second cantilever beam and the cantilever supporting structure. One of the stack of dielectric layers is removed to expose first portions of the first sub-pillars and second portions of the second sub-pillars. Isolation structures are formed between the first sub-pillars and the respective second sub-pillars.

20 Claims, 21 Drawing Sheets

3D SEMICONDUCTOR APPARATUS MANUFACTURED WITH A CANTILEVER STRUCTURE AND METHOD OF MANUFACTURE THEREOF

INCORPORATION BY REFERENCE

This present disclosure claims the benefit of U.S. Provisional Application No. 63/046,929, "3D DEVICE LAYOUT AND METHOD USING 3D CANTILEVER SUPPORT" filed on Jul. 1, 2020, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

This disclosure relates to microelectronic devices including semiconductor devices, transistors, and integrated circuits, and methods of microfabrication. In the manufacture of a semiconductor device (especially on a microscopic scale), various fabrication processes (e.g., film-forming depositions, etch mask creation, patterning, material etching and removal, and doping treatments) can be executed. The fabrication processes can be performed repeatedly to form desired semiconductor device elements on a substrate. In some embodiments, with microfabrication, transistors can be created in one plane (e.g., an active device plane), with wiring/metallization formed above the active device plane, and thus can be characterized as two-dimensional (2D) circuits and the fabrication process can be characterized as a 2D fabrication. Scaling efforts have increased a number of transistors per unit area in 2D circuits. As dimensions of semiconductor devices scale to smaller sub-micron sizes in advanced technology nodes, improved structures and methods for manufacturing same are desired.

SUMMARY

Aspects of the disclosure provide a method of forming a semiconductor apparatus. A stack of dielectric layers can be formed over a semiconductor layer on a substrate of the semiconductor apparatus. Multiple openings can be formed in the stack of dielectric layers. The multiple openings can uncover the semiconductor layer and extend along a Z direction that is substantially perpendicular to the substrate. Multiple pillars can be formed in the multiple openings. The multiple pillars can include first sub-pillars made of a first semiconductor material and second sub-pillars made of a second semiconductor material. The first sub-pillars and the second sub-pillars can be separated by an interface in one of the stack of dielectric layers. A cantilever structure that includes a first cantilever beam and a second cantilever beam can be formed. The first cantilever beam and the second cantilever beam can be portions of a cantilever dielectric layer over the stack of dielectric layers. A cantilever supporting structure that includes a portion of a first subset of the multiple pillars can be formed. The cantilever supporting structure can be formed based at least on the first cantilever beam and can extend from the first cantilever beam down to a first depth in the stack of dielectric layers.

The first depth can be at least below the one of the stack of dielectric layers. The first cantilever beam can connect the second cantilever beam and the cantilever supporting structure. The one of the stack of dielectric layers can be removed to uncover first portions of the first sub-pillars and second portions of the second sub-pillars. Isolation structures can be formed between the first sub-pillars and the respective second sub-pillars.

In an embodiment, the stack of dielectric layers comprises one or more first dielectric layers having a first dielectric material, second dielectric layers having a second dielectric material, and third dielectric layers having a third dielectric material where the one or more first dielectric layers can include the one of the stack of dielectric layers. In an example, the first dielectric material, the second dielectric material, and the third dielectric material are different from each other.

In an embodiment, the first depth corresponds to the semiconductor layer, and the cantilever supporting structure extends down to the semiconductor layer.

In an embodiment, the first depth corresponds to a lower surface of the one of the stack of dielectric layers, and the cantilever supporting structure extends down to the lower surface of the one of the stack of dielectric layers.

In an embodiment, forming the isolation structures further comprises oxidizing the first portions of the first sub-pillars into first oxide structures, and oxidizing the second portions of the second sub-pillars into second oxide structures. The isolation structures can include the first oxide structures and the second oxide structures.

In an embodiment, the second dielectric layers can be removed to expose third portions of the first sub-pillars and fourth portions of the second sub-pillars. First gate structures can be formed over the third portions of the first sub-pillars, and second gate structures can be formed over the fourth portions of the second sub-pillars.

In an embodiment, forming the first gate structures includes forming a first gate dielectric layer over the third portions of the first sub-pillars, and forming a first metal layer over the first gate dielectric layer. Forming the second gate structures includes forming a second gate dielectric layer over the fourth portions of the second sub-pillars, and forming a second metal layer over the second gate dielectric layer.

In an example, forming the first gate dielectric layer includes selectively forming a first high dielectric (high-K) layer over the third portions of the first sub-pillars. The first high-K layer is not formed over the third dielectric layers, and the first gate dielectric layer is the first high-K layer. Forming the second gate dielectric layer includes selectively forming a second high-K layer over the fourth portions of the second sub-pillars. The second high-K layer is not formed over the third dielectric layers, and the second gate dielectric layer is the second high-K layer.

In an example, the first gate dielectric layer and the second gate dielectric layer include an interface oxide.

In an example, the first gate structures are identical to the second gate structures.

In an embodiment, the first cantilever beam is directly above the first subset of the multiple pillars, and the second cantilever beam is directly above a second subset of the multiple pillars.

In an embodiment, the first cantilever beam is substantially perpendicular to the second cantilever beam.

In an example, the cantilever structure further includes a third cantilever beam that is substantially parallel to the first cantilever beam and is connected to the second cantilever beam. The third cantilever beam can be a portion of the cantilever dielectric layer. The cantilever supporting structure can further include a portion of a third subset of the multiple pillars. The cantilever supporting structure can be formed based on the first cantilever beam and the third cantilever beam.

Portions of the stack of dielectric layers, portions of the first gate structures, and portions of the second gate structures that are between adjacent ones of the multiple pillars can be removed to form trenches that isolate stacks of semiconductor devices. Each of the isolated stacks of semiconductor devices can include a first device and a second device that is stacked above the first device. The first device can be formed based on one of the first sub-pillars and the respective first gate structure, and the second device can be formed based on one of the second sub-pillars and the respective second gate structure.

In an example, the one of the third portions corresponds to a first channel region of the first device, and the one of the fourth portions corresponds to a second channel region of the second device.

In an example, the cantilever structure over the stack of dielectric layers can be removed.

In an example, a dielectric layer can be deposited to fill the trenches.

In an example, the first device is one of an n-type metal-oxide semiconductor (MOS) (NMOS) device and a p-type MOS (PMOS) device, and the second device is another one of the NMOS device and the PMOS device. The second device is isolated from the first device by one of the isolation structures.

One of the stacks of semiconductor devices is isolated from adjacent stacks of semiconductor devices by the trenches filled with the dielectric layer.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
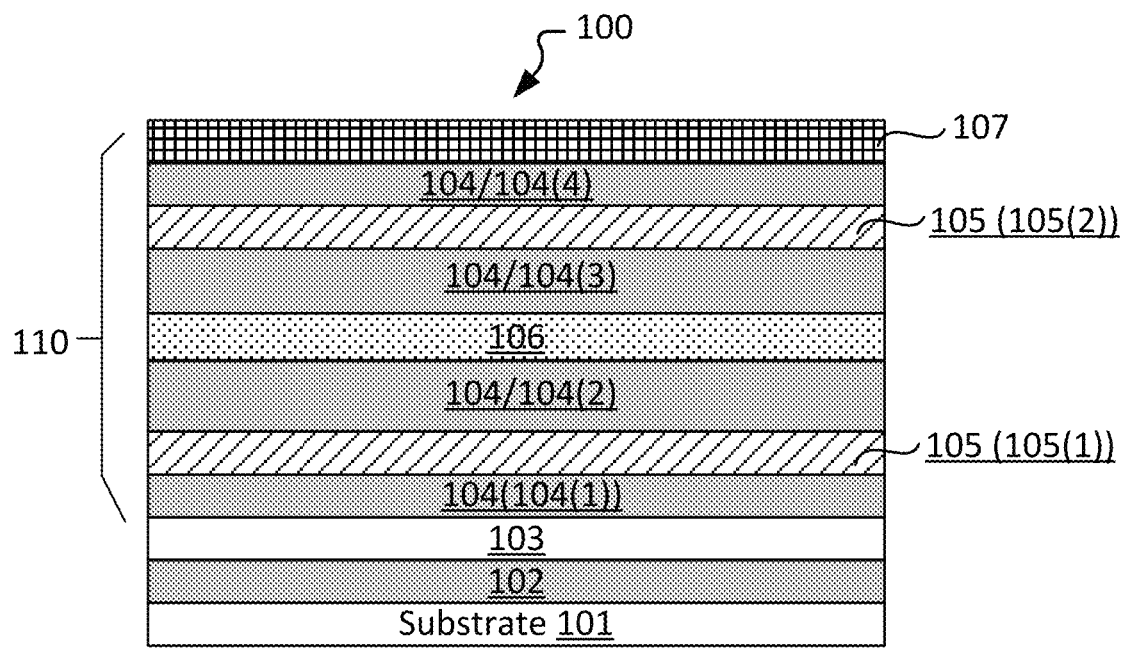
FIGS. 1-3, 5, 10, 11, 13-20, 22, 23, 25, 26, 28, 30, 32, and 34 show exemplary cross sectional views of a semiconductor apparatus 100 in various steps of a process flow according to some embodiments of the disclosure.

A three-dimensional (3D) semiconductor apparatus (e.g., a 3D semiconductor circuit) where devices (e.g., transistors) are stacked on top of each other can increase a device density (e.g., a number of devices per unit area), for example, as scaling enters single digit nanometer semiconductor device fabrication nodes. Semiconductor devices (e.g., transistors) can be stacked along a Z direction that is substantially perpendicular to a substrate plane of the 3D semiconductor apparatus to increase the device density (e.g., a number of semiconductor devices per unit area of the substrate plane). The substrate plane can be a planar working surface of a substrate of the 3D semiconductor apparatus.

3D integration, such as a vertical stacking of multiple devices, can be a viable approach to continue semiconductor scaling in critical dimension scaling. As a contacted gate pitch reaches a scaling limit due to manufacturing variability and electrostatic device limitations, two-dimensional (2D) transistor density scaling can be challenging. 3D integration can overcome the scaling limitations by increasing a transistor density, such as demonstrated in the flash memory industry by implementing 3D NAND. A number of transistors in a volume can be significantly larger than a number of transistors over an area when an area occupied by the volume on a 2D plane is identical to the area. In some embodiments, device stacking is implemented by flash memory industry with the adoption of 3D NAND. In some examples, application of device stacking in random logic designs is challenging. 3D integration for logic chips, such as in central processing unit (CPU), graphics processing unit (GPU), field programmable gate array (FPGA), System on a chip (SoC), may be important in moving the semiconductor roadmap forward.

According to aspects of the disclosure, techniques herein can enable 3D devices (e.g., 3D semiconductor devices) to be isolated (e.g., physically separated and electrically isolated) vertically using an upper cantilever structure (also referred to as cantilever support). The cantilever structure herein can be applied to any region (e.g., a gate region or a gate structure, source/drain (S/D) regions or terminals) of a transistor that, for example, needs support due to a small size of the region. For example, a gate structure (also referred to as a gate electrode) can be formed with a cantilever structure. Embodiments can use disposable upper level cantilever beams that can be patterned for specific circuit applications for scaling below, for example, 3 nm devices.

Techniques herein function with vertically grown channels of respective transistors (e.g., a p channel for a p-type transistor, an n channel for an n-type transistor). Because epitaxial material(s)/structure(s) are grown vertically, for example, within preformed holes or openings in a stack of dielectric layers, such structures (e.g., the vertically grown channels) can be self-aligned to the precise dielectric stack. The self-alignment can enable 3D isolation to be precisely placed at desired locations to isolate each vertical transistor (e.g., a gate-all-around (GAA) transistor) in a stack of transistors, for example, for extreme device scaling application.

Techniques herein include methods to form 3D isolation and 3D gate electrodes integrated together using a cantilever structure for vertical 3D semiconductor devices. Multiple stacks of 3D semiconductor devices (e.g., p-type metal-oxide semiconductor (MOS) (PMOS) devices, n-type MOS (NMOS) devices) or any suitable device elements can be stacked with isolation and can be achieved with increased circuit density using the methods and the cantilever structure. Benefits can include a 360° access to transistors with 3D isolation for an improved circuit layout.

FIGS. 1-3, 5, 10, 11, 13-20, 22, 23, 25, 26, 28, 30, 32, and 34 show exemplary cross sectional views of a semiconductor apparatus 100 in various steps of a process flow according to some embodiments of the disclosure. FIGS. 4, 6-9, 12, 21, 24, 27, 29, 31, and 33 show exemplary top views of the semiconductor apparatus 100 in various steps of the process flow according to some embodiments of the disclosure. FIGS. 35A-35B shows an exemplary process flow 3500 to form a semiconductor apparatus (e.g., the semiconductor apparatus 100) according to an embodiment of the disclosure. The semiconductor apparatus can include multiple stacks of semiconductor devices (e.g., transistor stacks) and can be fabricated using a cantilever structure where each of the multiple stacks of semiconductor devices can include any suitable number (e.g., 2, 10, or the like) of vertically stacked semiconductor devices (e.g., transistors). The descriptions for FIGS. 1-34 and 35A-35B are given where each of the multiple stacks of semiconductor devices includes two vertically stacked semiconductor devices, however, the descriptions can be suitably adapted to a stack having any suitable number of vertically stacked transistors with one or more cantilever structures depending on circuit requirements. Embodiments can include any suitable number of the multipole stacks of semiconductor devices, such as approximately 50 to 100 vertical transistor stacks that can be positioned between two cantilever support rails of a cantilever structure.

The process flow 3500 starts at S3501. Referring to FIGS. 1 and 35A, at S3501, a stack of dielectric layers 110 can be formed over a semiconductor layer 103 on a substrate 101 of the semiconductor apparatus 100. The stack of dielectric layers 110 can be formed along a Z direction that is substantially perpendicular to the substrate 101. The stack of dielectric layers 110 can include any suitable dielectric layers having any suitable thicknesses. In an example shown in FIG. 1, the stack of dielectric layer 110 includes a first dielectric layer 106 having a first dielectric material, second dielectric layers 105 (e.g., 105(1)-105(2)) having a second dielectric material, and third dielectric layers 104 (e.g., 104(1)-104(4)) having a third dielectric material. The third dielectric layers 104 can separate the first dielectric layer 106 and the second dielectric layers 105. The stack of dielectric layers 110 can include a hard mask layer 107.

The layers (e.g., 104-107) in the stack of dielectric layers 110 can have any suitable thicknesses, for example, based on device performance and/or fabrication requirements of the semiconductor apparatus 100.

The first dielectric material, the second dielectric material, and the third dielectric material can be different from each other. The first dielectric layer 106, the second dielectric layers 105, and the third dielectric layers 104 can be selective to one another in that one dielectric layer (e.g., one material) can be etched without etching remaining dielectric layers (e.g., remaining materials). Material compositions and thus etching properties of the first dielectric layer 106, the second dielectric layers 105, and the third dielectric layers 104 can be different. For example, a first etching process to remove the first dielectric layer 106 does not etch or minimally etch the second dielectric layers 105 and the third dielectric layers 104; a second etching process to remove the second dielectric layers 105 does not etch or minimally etch the first dielectric layer 106 and the third dielectric layers 104; and a third etching process to remove the third dielectric layers 104 does not etch or minimally etch the first dielectric layer 106 and the second dielectric layers 105.

Figure 29:
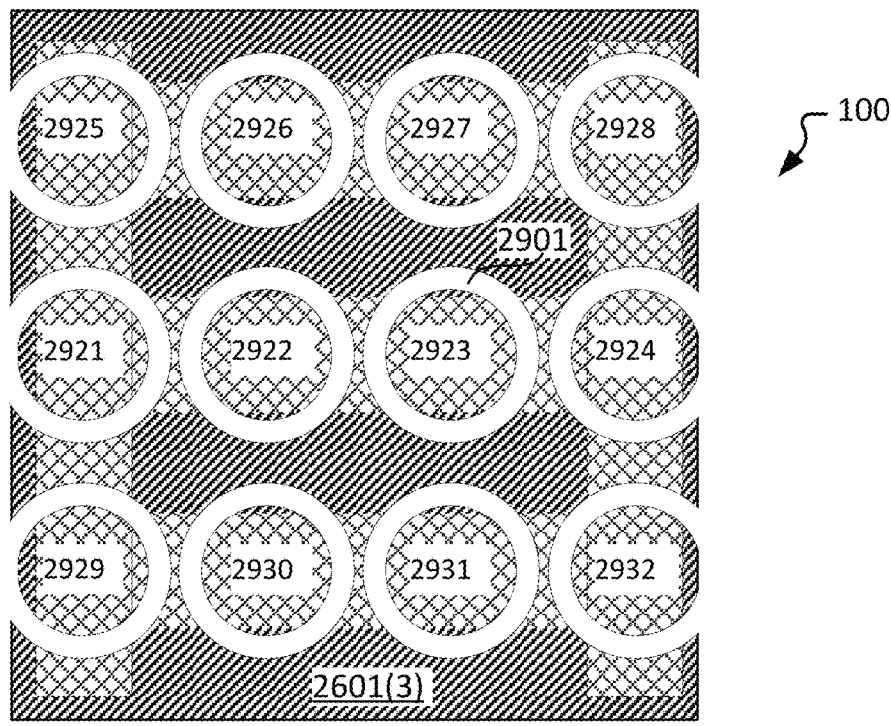

Regions occupied by the second dielectric layer 105(1) and the third dielectric layers 104(1)-104(2) correspond to future first transistors (e.g., a semiconductor device 2921(1) in FIG. 29). Regions occupied by the second dielectric layer 105(2) and the third dielectric layers 104(3)-104(4) correspond to future second transistors (e.g., a semiconductor device 2921(2) in FIG. 29). Future gate structures (or gate electrode regions for, for example, GAA vertically grown devices) (e.g., 2801(1)-(2) in FIG. 34) of the future first transistors (e.g., 2921(1) in FIG. 34) and the future second transistors (e.g., 2921(2) in FIG. 34) are to be formed in regions occupied by the second dielectric layers 105. Future isolation structures (e.g., 1901 in FIG. 34) are to be formed in a region occupied by the first dielectric layer 106 and are positioned between the future first transistors and the future second transistors, for example, to physically and electrically separate the future first transistors and the respective future second transistors. In addition to a gate region (or a gate structure), other regions of a transistor (e.g., a channel region, S/D regions) can be formed and the descriptions of the disclosure can be suitably adapted to provide a method of making 3D isolations and 3D gate electrodes between post channel formation.

The semiconductor layer 103 can be a doped semiconductor layer, such as an n-doped (or N+) semiconductor layer or a p-doped (or P+) semiconductor layer. The semiconductor layer 103 can be formed by epitaxial growth. The semiconductor layer 103 can be doped with Phosphorous (P) or Arsenic (As) for NMOS devices or Boron (B) for PMOS devices, for example, by a diffusion process, an implantation process, and/or the like.

In an example shown in FIG. 1, the semiconductor layer 103 is an n-doped semiconductor layer, such as an N+ silicon (Si) layer 103 formed by epitaxial growth or by ion implantation. A dielectric layer 102 can be formed between the substrate 101 and the semiconductor layer 103, for example, to isolate the stack of dielectric layers 110 from the substrate 101.

The substrate 101 can include any suitable semiconductor material, such as Si, silicon carbide (SiC), sapphire, germanium (Ge), gallium arsenide (GaAs), silicon germanium (SiGe), indium phosphide (InP), diamond, and the like. The semiconductor material(s) can include single crystal (or monocrystalline) material(s), polycrystalline material(s), and/or amorphous material(s). The substrate 101 can be doped with an n-type and a p-type impurity. The substrate 101 can include various layers, such as conductive or insulating layers formed on a semiconductor substrate, a silicon-on-insulator (SOI) structure, and the like.

Figure 2:
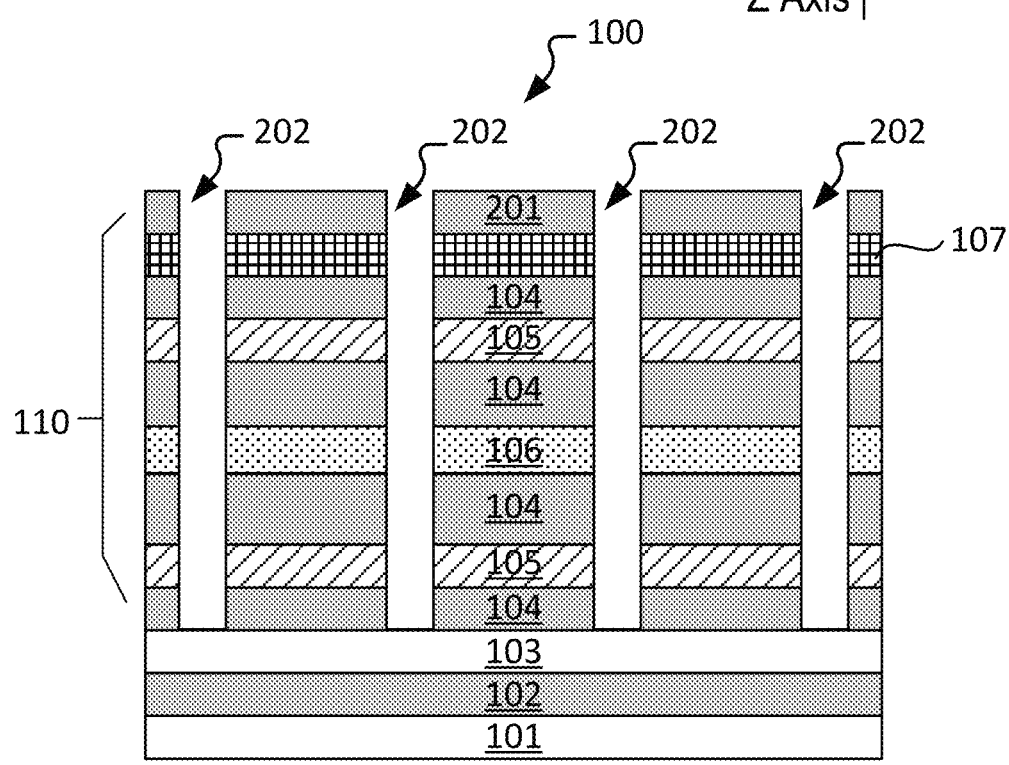

Referring to FIGS. 2 and 35A, at S3503, multiple openings (or vias) 202 can be formed in the stack of dielectric layers 110. The multiple openings 202 can uncover the semiconductor layer 103 and extend along the Z direction. A photoresist layer can be formed over the hard mask layer 107 and subsequently patterned to form a photoresist etch mask 201. The photoresist etch mask 201 can be used in etching the multiple openings 202 in the stack of dielectric layers 110 down to the semiconductor layer 103. The multiple openings 202 can have any suitable shape (e.g., a cylindrical shape, a rectangular shape, or the like) and any suitable size (e.g., a diameter on an order of a nanometer (nm), an order of 10 nm, between 3 to 5 nm, below 3 nm, or the like). In an example, the size (e.g., the diameter) of the multiple openings 202 is configured to determine a size of the semiconductor devices fabricated using the process flow 3500. The photoresist etch mask 201 can be removed after forming the multiple openings 202.

Figure 3:
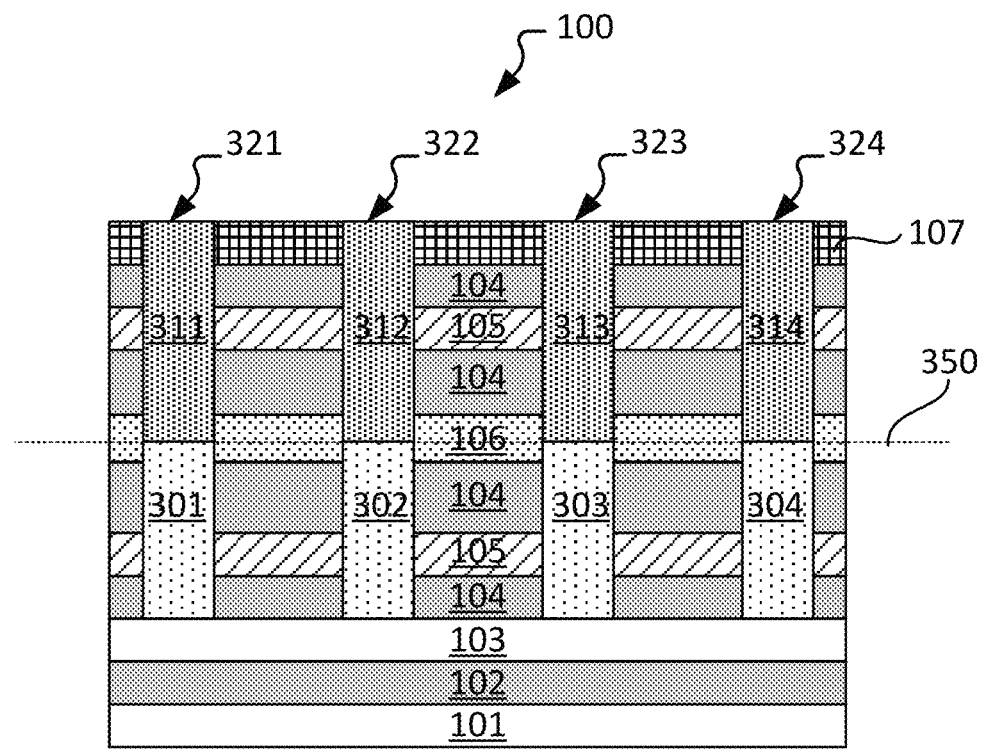
Figure 4:
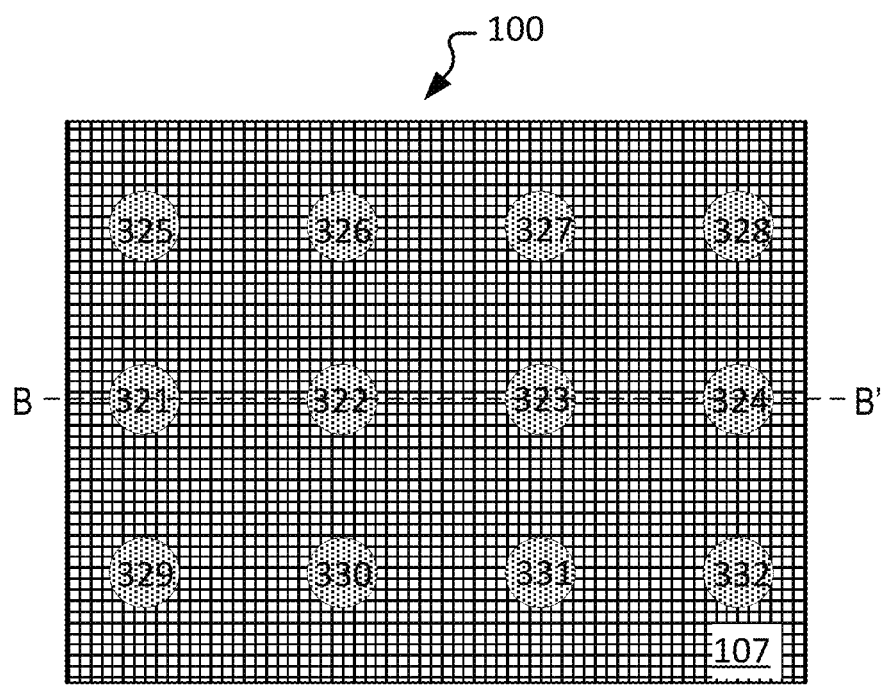
FIGS. 4, 6-9, 12, 21, 24, 27, 29, 31, and 33 show exemplary top views of the semiconductor apparatus 100 in various steps of the process flow according to some embodiments of the disclosure.

Referring to FIGS. 3, 4, and 35A, at S3505, multiple pillars 321-332 can be formed in the multiple openings 202. Each pillar can include a plurality of sub-pillars. FIG. 4 shows a top view of the multiple pillars 321-332. In an example, the multiple pillars 321-332 have a cylindrical shape, and the top view shows a circular shape of each pillar. FIG. 3 shows a cross-sectional view of the pillars 321-324 sectioned at BB'. The pillars 321-324 include first sub-pillars 301-304 and respective second sub-pillars 311-314. The second sub-pillars 311-314 are vertically stacked above the respective sub-pillars 301-304. For example, the pillar 321 includes the first sub-pillar 301 and the second sub-pillar 311. The first sub-pillars 301-304 and the second sub-pillars 311-314 can be separated by an interface 350 that is in the first dielectric layer 106. The interface 350 can be in a middle position within the first dielectric layer 106.

The first sub-pillars can be made of a first semiconductor material (e.g., N+ semiconductor material) and the second sub-pillars can be made of a second semiconductor material (e.g., P+ semiconductor material). The multiple pillars 321-332 can be formed by suitable epitaxial growth in situ. In an example shown in FIG. 3, the first sub-pillars 301-304 are formed by N+ epitaxial growth within the openings 202 over the N+Si layer 103 and are referred to as N+ first sub-pillars 301-304, and the second sub-pillars 311-314 are formed by P+ epitaxial growth within the openings 202 and over the N+ first sub-pillars 301-304, respectively, and are referred to as P+ second sub-pillars 311-304. The multiple pillars 321-332 can be grown vertically along the Z direction via, for example, epitaxy growth within the pre-formed openings 202 and can be precisely self-aligned to the stack of dielectric layers 110.

Figure 34:
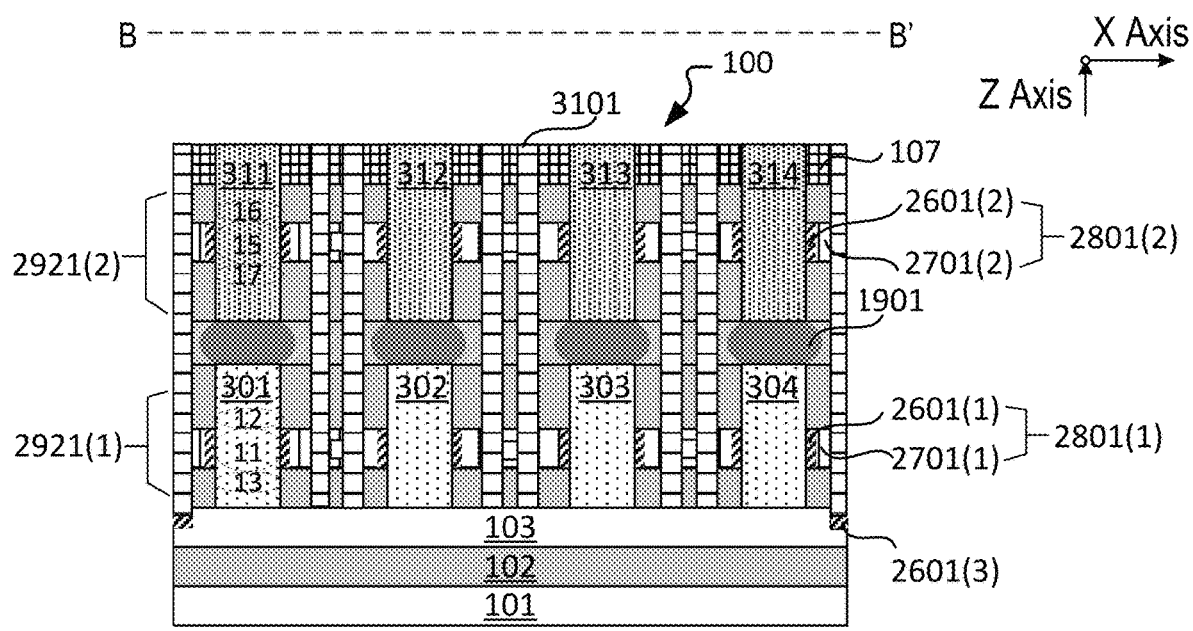
Figure 35A:
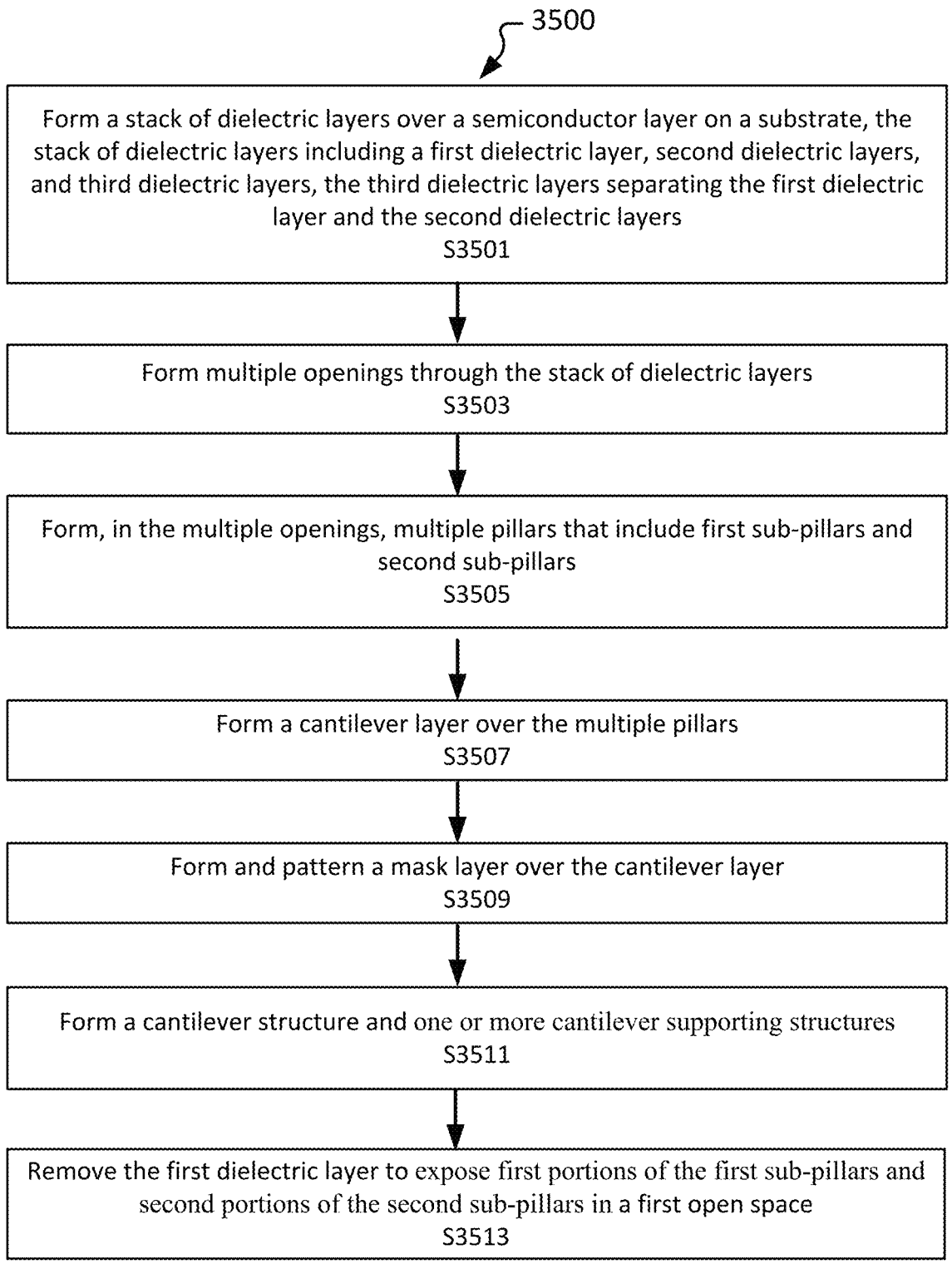
FIGS. 35A-35B shows an exemplary process flow to form a semiconductor apparatus according to an embodiment of the disclosure.
Figure 35B:
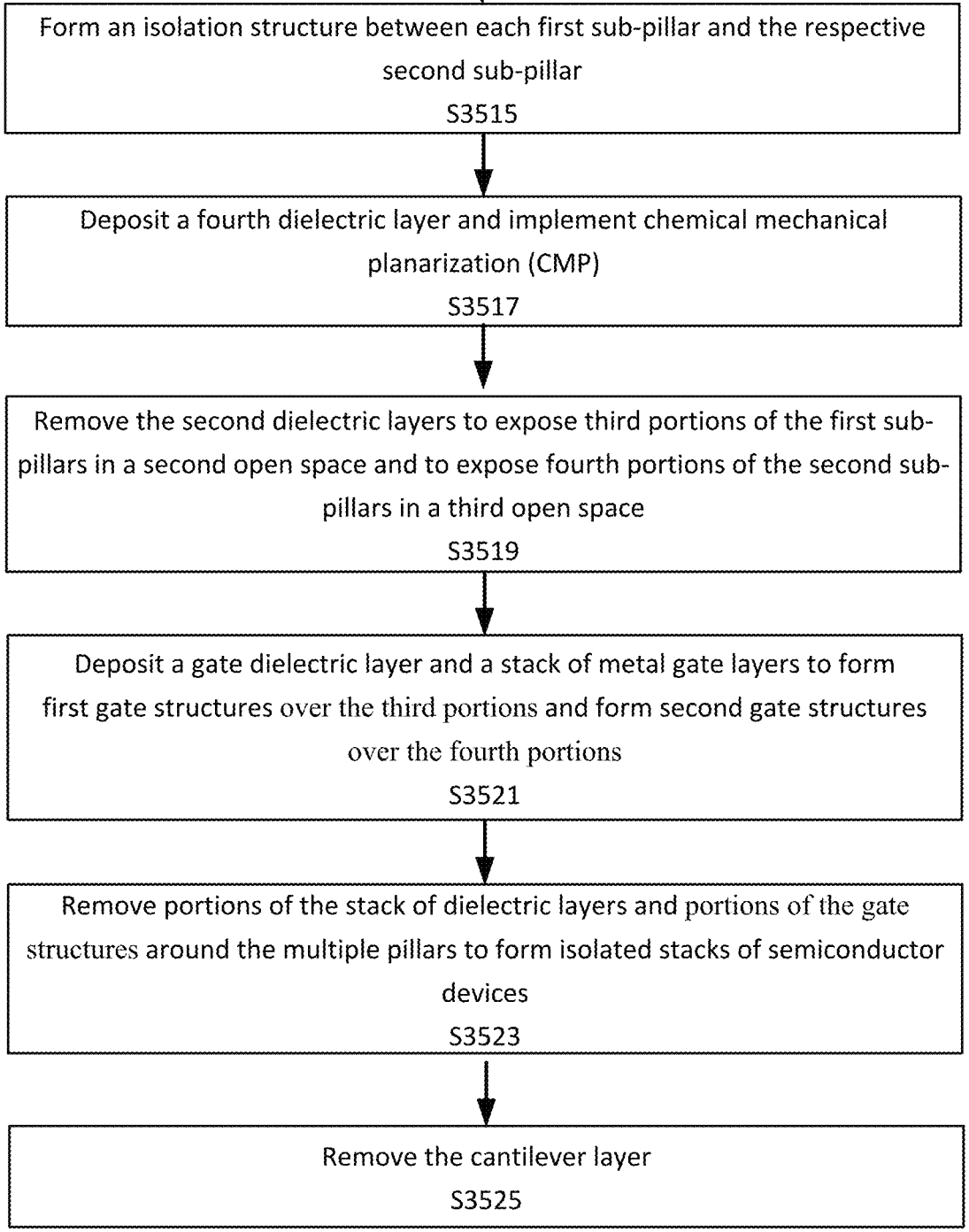

Referring to FIGS. 3 and 34, the semiconductor devices (e.g., 2921(1)-(2)) within each (e.g., 2921) of the stacks of semiconductor devices 2921-2932 can be self-aligned with each other. For example, the semiconductor device 2921(1) includes a first channel region 11, first S/D regions 12-13, and a first gate structure 2801(1). The first channel region 11 and the first S/D regions 12-13 are portions of the first sub-pillar 301 where the first channel region 11 are positioned between the first S/D regions 12-13. The first channel region 11 is surrounded by the first gate structure 2801(1).

The semiconductor device 2921(2) includes a second channel region 15, second S/D regions 16-17, and a second gate structure 2801(2). The second channel region 15 and the second S/D regions 16-17 are portions of the second sub-pillar 311 where the second channel region 15 are positioned between the second S/D regions 16-17. The second channel region 15 is surrounded by the second gate structure 2801(2).

Because the first sub-pillar 301 and the second sub-pillar 311 are self-aligned, the first channel region 11 and the second channel region 15 are self-aligned. Accordingly, the semiconductor device 2921(1) is self-aligned with the semiconductor device 2921(2). Thus, the device density of the semiconductor apparatus 100 can be increased with relatively low cost when a number of semiconductor devices vertically stacked in the stack of semiconductor devices is increased, for example, due to self-alignment of the vertically stacked semiconductor devices in each stack.

Step S3505 can be suitably adapted, for example, based on the doping of the semiconductor layer 103 and/or the substrate 101. For example, when the semiconductor layer 103 is P+ semiconductor layer, the first sub-pillars 301-304 can be formed by P+ epitaxial growth over the P+ semiconductor layer, and the second sub-pillars 311-314 can be formed by N+ epitaxial growth over the P+ first sub-pillars 301-304, respectively. The first sub-pillars 301-304 and/or the second sub-pillars 311-314 can be un-doped or doped using any suitable epitaxy semiconductor material, for example, depending on circuit and device requirements.

Figure 5:
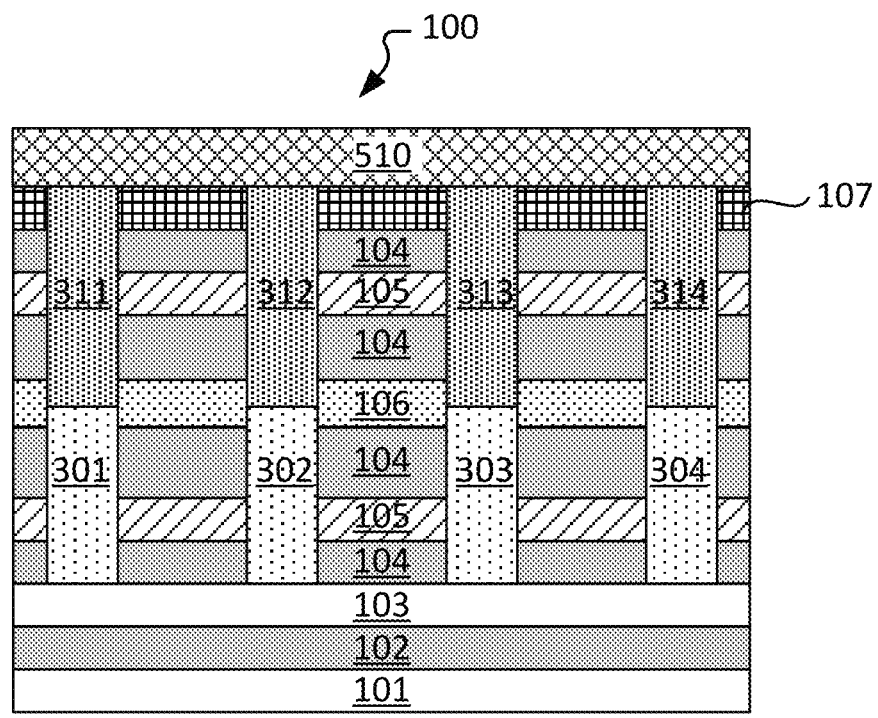
Figure 6:
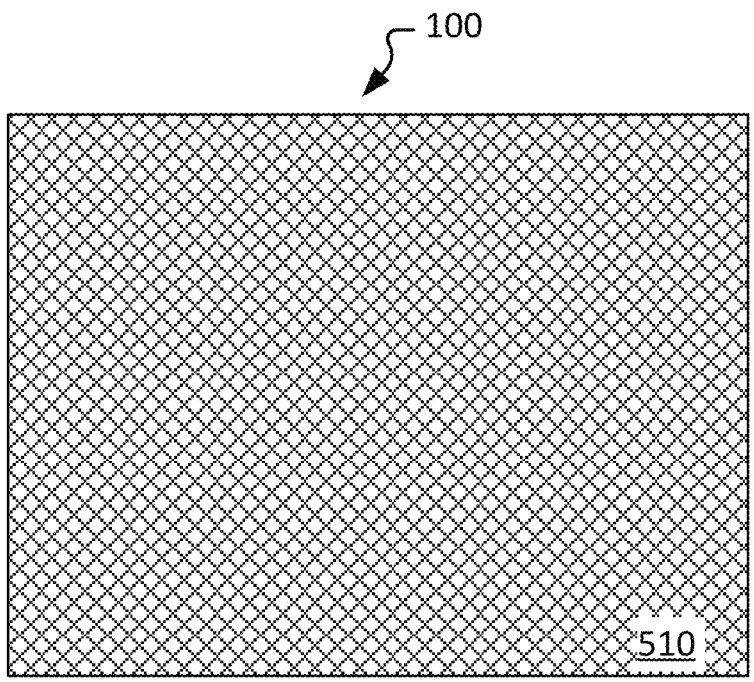

Referring to FIGS. 5, 6, and 35A, at S3507, a cantilever layer 510 can be formed over the stack of dielectric layers 110 where the multiple pillars 321-332 are formed. Referring to FIG. 5, the cantilever layer 510 is over the multiple pillars 321-332 and the hard mask layer 107. The cantilever layer 510 can include any suitable material with sufficient strength, such as nitride (e.g., silicon nitride, germanium nitride), and can be formed by any suitable method, such as film deposition. The cantilever layer 510 can be a cantilever dielectric layer. In an example, the cantilever layer 510 (e.g., a nitride layer) is formed by plasma enhanced chemical vapor deposition (PECVD). In an example, Si-based and Ge-based materials are preferred. Other materials with similar strength can also be used. The cantilever layer 510 can be formed using material(s) with suitable mechanical strength. FIG. 6 shows a top view of the cantilever layer 510.

As a diameter and a cross-sectional area of semiconductor devices (also referred to as nano devices) is reduced below a 3-5 nm regime, processing of stacked transistors can be enhanced by placing a disposable upper cantilever structure (e.g., including cantilever beam(s)) to support the 3D devices (e.g., 2921-2932) while 3D isolation (e.g., the isolation structures 1901) is formed, as described below. In an example, nitride is used as the cantilever beam material.

Figure 7:
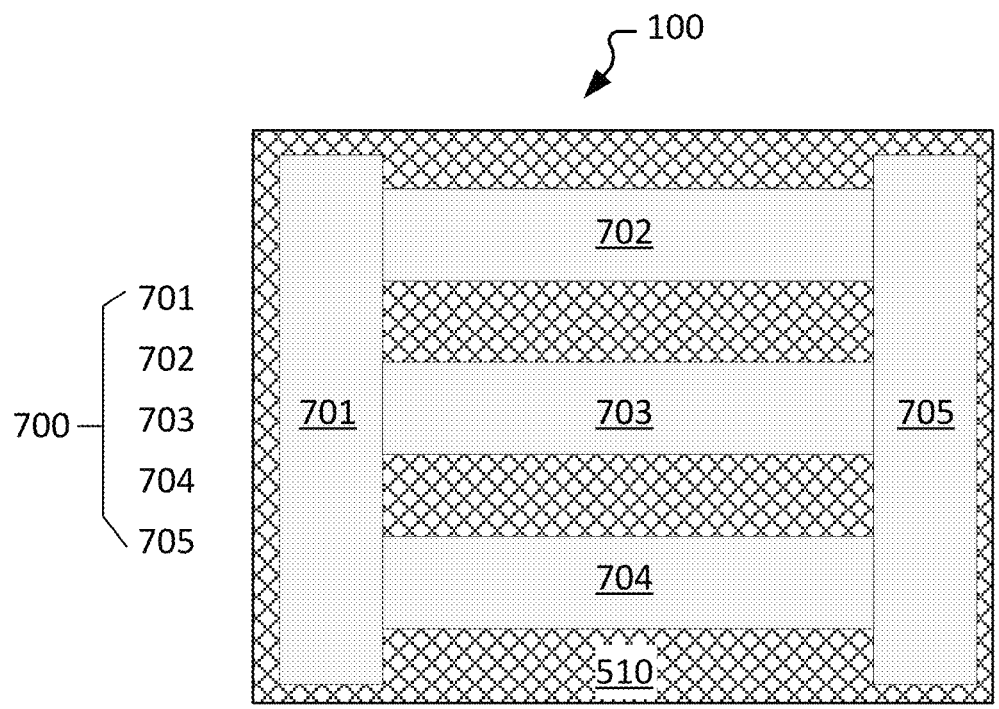
Figure 8:
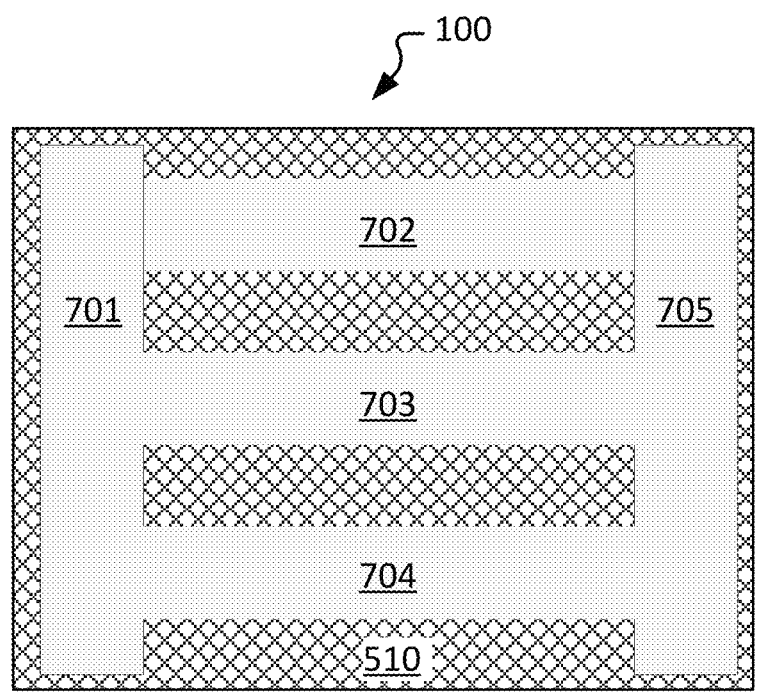

Referring to FIGS. 7, 8, and 35A, at S3509, a mask layer 700 can be formed and patterned over the cantilever layer 510. The mask layer 700 can include mask beams 701-705. In FIG. 8, the mask layer 700 is shown as partially transparent to display the multiple pillars 321-332 beneath the mask layer 700.

Referring to FIGS. 9-14 and 35A, at S3511, a cantilever structure 900 can be formed by an etching process based on the pattern of the mask layer 700. The cantilever structure 900 can include cantilever beams 501-505. The cantilever beams 501-505 are portions of the cantilever layer 510 that is over the stack of dielectric layers 110.

One or more cantilever supporting structures, such as cantilever supporting structures 901-902 can be formed by removing portions of the stack of dielectric layers 110 down to a first depth in the stack of dielectric layers 110. The cantilever supporting structures 901-902 can be formed based on the cantilever beams 501-502, respectively, and can extend from the cantilever beams 501-502 down to the first depth. The cantilever structure 900 can be supported by the one or more cantilever supporting structures (e.g., the cantilever supporting structures 901-902). Open spaces 911 including trenches 911(2)-911(3) and spaces 911(1) and 911(4)-(6) can also be formed. The first depth can reach at least below the first dielectric layer 106. The first depth can reach the semiconductor layer 103, the third dielectric layer 104(2), or the like. Subsequently, the mask layer 700 can be removed.

The multiple pillars 322-323, 326-327, and 330-331 can be formed into the stacks of semiconductor devices (e.g., transistors) 2922-2923, 2926-2927, and 2930-2931 in subsequently steps and can be referred to as transistor pillars. The cantilever supporting structure 901 can include at least a portion of the multiple pillars 321, 325, 329 and a portion of the stack of dielectric layers 110 that are beneath the cantilever beam 501. The multiple pillars 321, 325, 329 can be referred to as a subset (e.g., a first subset) of the multiple pillars 321-332. The cantilever supporting structure 902 can include at least a portion of the multiple pillars 324, 328, 332 and a portion of the stack of dielectric layers 110 that are beneath the cantilever beam 505. Thus, the multiple pillars 321, 324, 325, 328, 329, and 332 can be referred to as supporting pillars that are used to support the cantilever structure 900.

In an example, the multiple pillars 322-323 can be referred to as a subset (e.g., a second subset) of the multiple pillars 321-332. The cantilever beam 501 is directly above the first subset of the multiple pillars 321, 325, and 329, and the cantilever beam 502 is directly above the second subset (322-323) of the multiple pillars 321-332. The multiple pillars 324, 328, 332 can be referred to as a subset (e.g., a third subset) of the multiple pillars 321-332.

Figure 9:
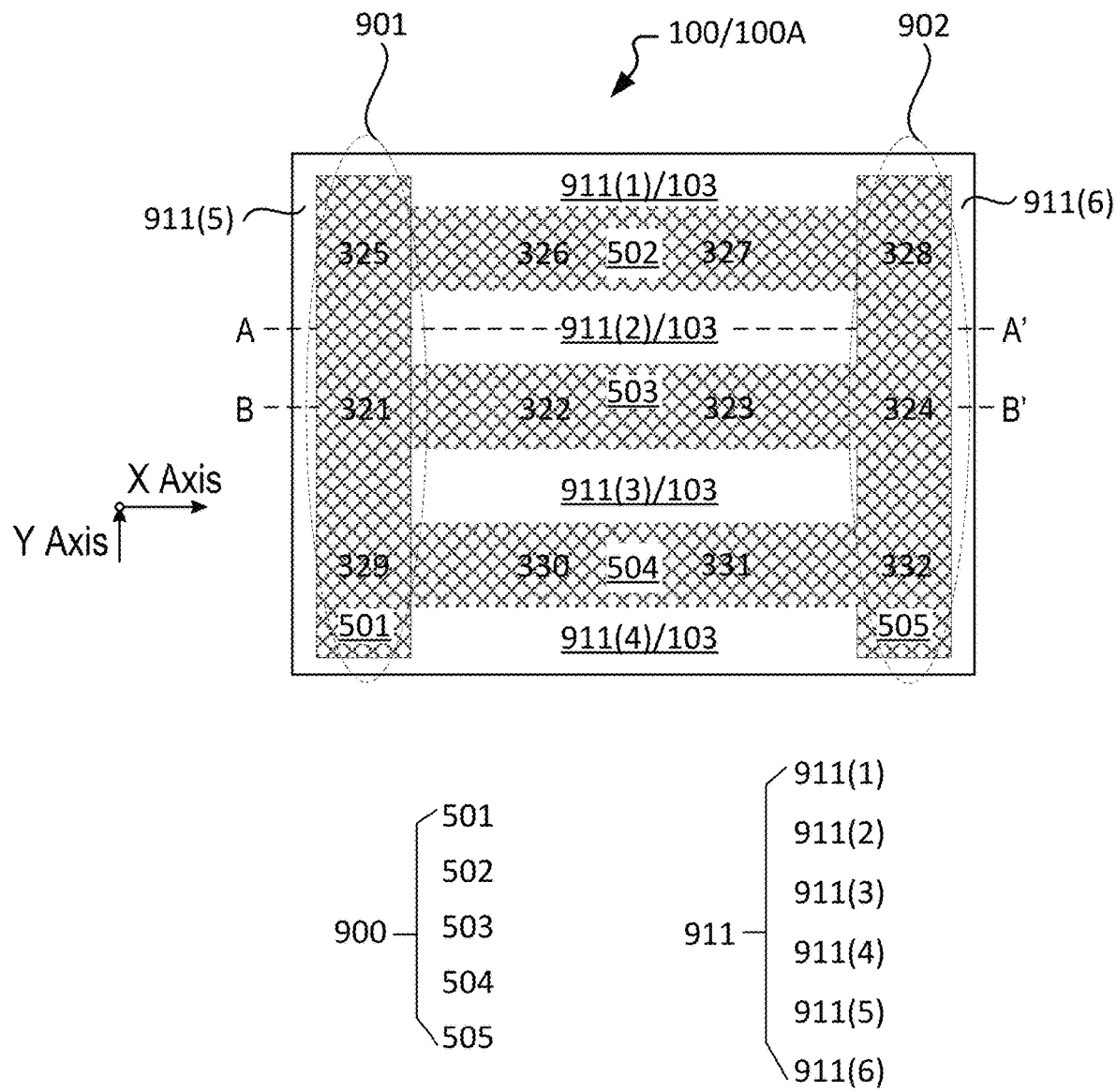
Figure 12:
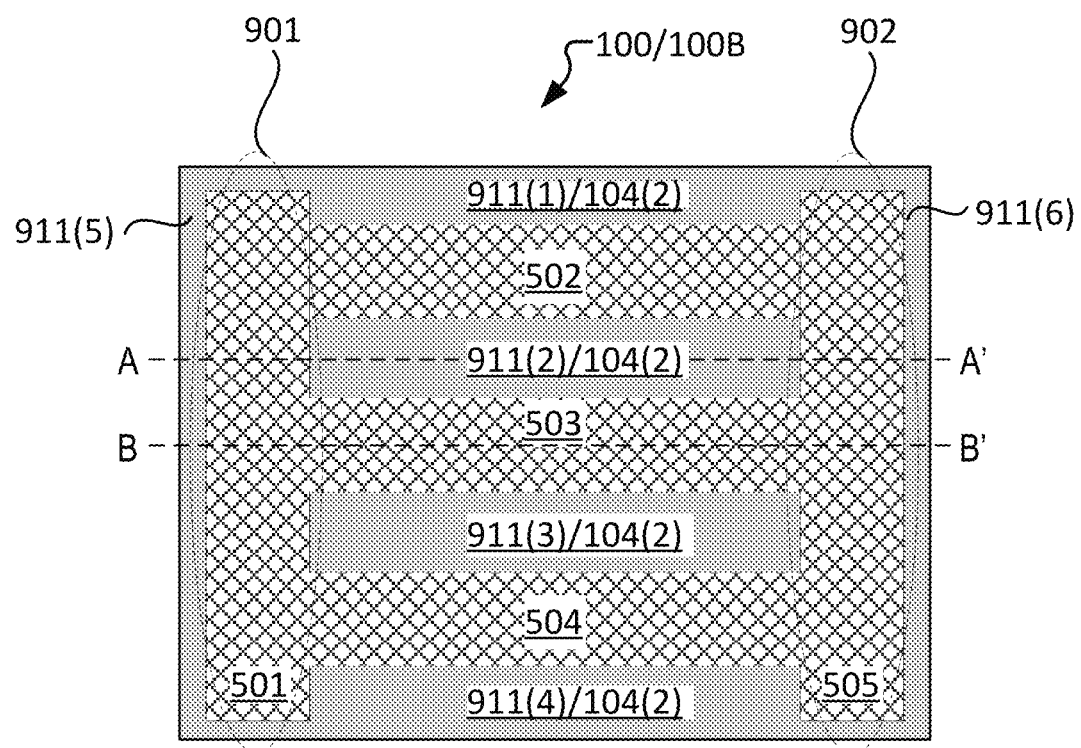

Referring to FIGS. 9 and 12, the cantilever beams 502-504 are above the transistor pillars 322-323, 326-327, and 330-331, respectively, and the cantilever supporting structures 901-902 can include the portion of the supporting pillars 321, 324, 325, 328, 329, and 332. The cantilever beam 501 is configured to connect the cantilever beams 502-504 to the cantilever supporting structure 901, and the cantilever beam 505 is configured to connect the cantilever beams 502-504 to the cantilever supporting structure 902.

The cantilever beams 502-504 can function as cantilevers, for example, when forming the isolation structures 1901, and the cantilever beams 501 and 505 are configured to connect the cantilever beams 502-504 to the cantilever supporting structures 901-902. Thus, the cantilever beams 502-504 can be referred to as cantilevers and the cantilever beams 501 and 505 can be referred to as cantilever rails.

Figure 10:
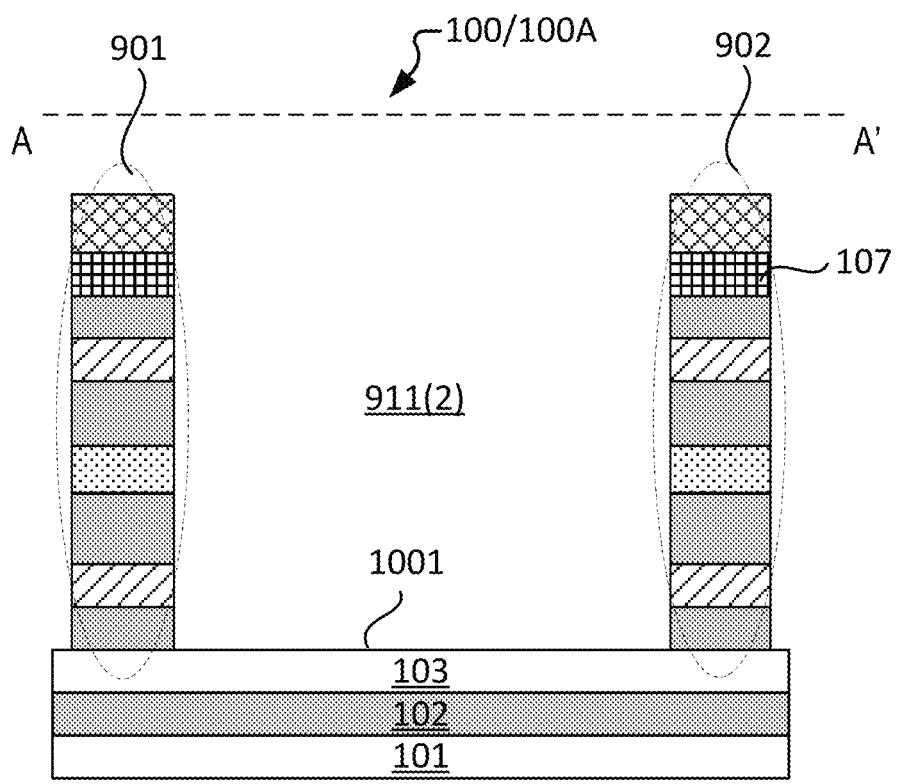
Figure 11:
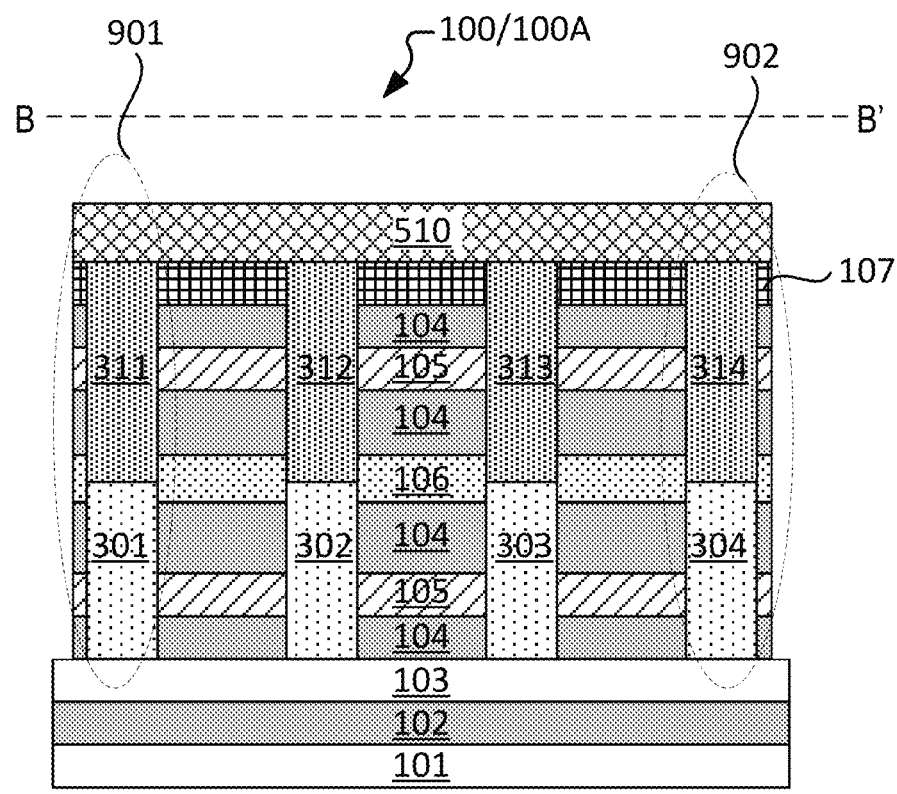

Referring to FIGS. 9-11, the first depth reaches the semiconductor layer 103, for example, the first depth is a level 1001 of an upper surface of the semiconductor layer 103, and step S3511 is referred to as an etch option A. The cantilever supporting structures 901-902 can extend down to the semiconductor layer 103. FIGS. 10-11 show cross-sectional views of FIG. 9 that are sectioned at AA' and BB' and the semiconductor apparatus 100 is also referred to as the semiconductor apparatus 100A for the etch option A. Referring to FIG. 10, the cantilever supporting structures 901-902 include the entire supporting pillars 321, 324, 325, 328, 329, and 332, and thus include both the first sub-pillars and the second sub-pillars of the multiple pillars 321, 324, 325, 328, 329, and 332.

Figure 13:
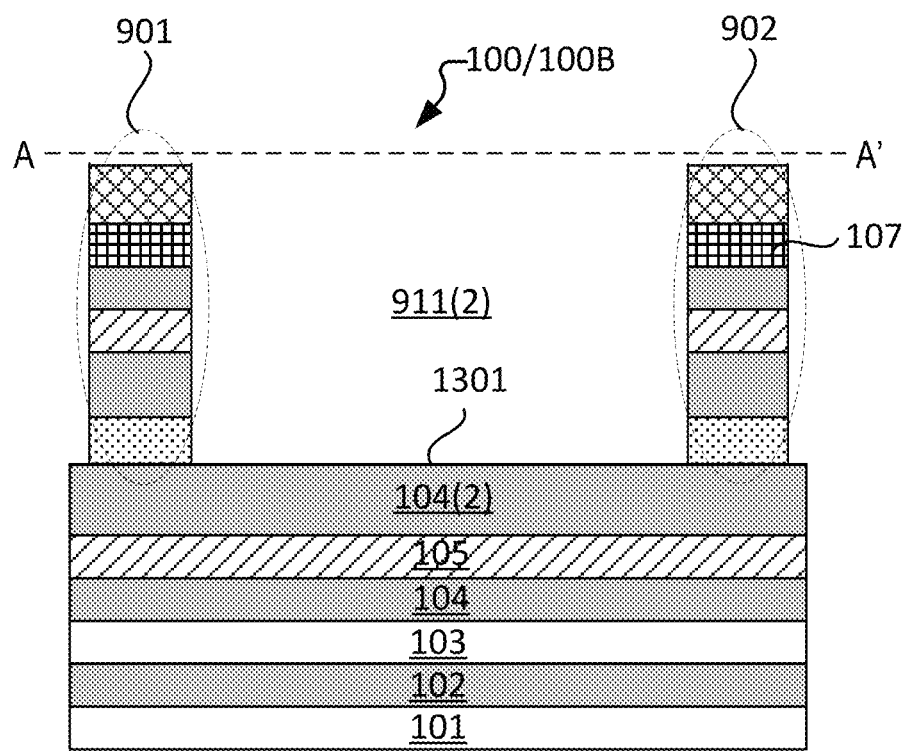
Figure 14:
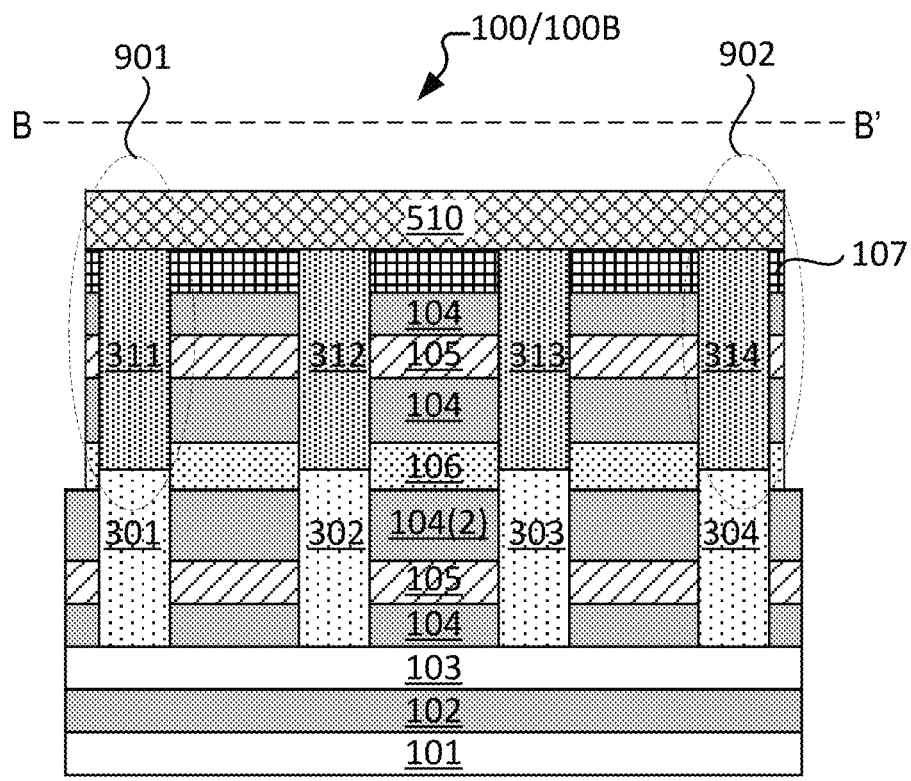

Referring to FIGS. 12-14, the first depth reaches the third dielectric layer 104(2), for example, the first depth is a level 1301 of an upper surface of the third dielectric layer 104(2), and step S3511 is referred to as an etch option B. The first depth can correspond to a lower surface of the first dielectric layer 106 where the lower surface of the first dielectric layer 106 borders the upper surface of the third dielectric layer 104(2) and is also at the level 1301. The cantilever supporting structures 901-902 can extend down to the lower surface (e.g., the level 1301) of the first dielectric layer 106. FIGS. 13-14 show cross-sectional views of FIG. 12 that are sectioned at AA' and BB' and the semiconductor apparatus 100 is also referred to as the semiconductor apparatus 100B for the etch option B. Referring to FIG. 13, the cantilever supporting structures 901-902 include an upper portion of the supporting pillars 321, 324, 325, 328, 329, and 332, for example, the second sub-pillars of the multiple pillars 321, 324, 325, 328, 329, and 332. The cantilever supporting structures 901-902 do not include the first sub-pillars of the multiple pillars 321, 324, 325, 328, 329, and 332.

In the example described above, a cantilever (e.g., 502, 503, or 504) is positioned above two transistor pillars (e.g., the transistor pillars 326-327) to facilitate 3D isolation of the two transistor pillars. In general, a cantilever can be positioned above any suitable number of transistor pillars (e.g., 50 to 100 transistor pillars), for example, depending on a pillar diameter of the transistor pillar.

Referring to FIG. 9, the cantilevers 502-504 are positioned between and thus are supported by two cantilever supporting structures (e.g., the cantilever supporting structures 901-902). When a number of transistor pillars beneath a cantilever (e.g., 502, 503, or 504) is relatively small, such as 2, the cantilever can be connected to and is supported by only one cantilever supporting structure. For example, the cantilever supporting structure 902 can be omitted. In an example, in order to facilitate the 3D isolation for the transistor pillars 322-323, a cantilever structure includes the cantilever 503 and the cantilever rail 501 where the cantilever rail 501 is configured to connect the cantilever 503 to the cantilever supporting structure 901. Thus, one or a pair of cantilever supporting structures can support a plurality of transistor pillars at nanometer scales. Alternatively, more than two cantilever supporting structures can be connected to a cantilever and thus can provide support to the cantilever. For example, when a device density (e.g., a number of transistor pillars beneath the cantilever and/or a number of semiconductor devices in each vertical stack) increases, a number of cantilever supporting structures can increase and/or a larger area or a thicker cantilever can be used.

The cantilever structure 900 can have any suitable shape and size, and thus the cantilever beams 501-505 can have any suitable shapes and sizes. One of the cantilevers (e.g., 502-504) can form any suitable angle with one of the cantilever rails (e.g., 501 and 505), for example, depending on distributions and numbers of the transistor pillars and the supporting pillars. Referring to FIGS. 9 and 12, the angle can be 90° where the one of the cantilevers (e.g., 502, 503, or 504) is perpendicular to the one of the cantilever rails (e.g., 501 or 505). The angle can be less than 90°.

The shapes and sizes of the cantilever beams 501-505 can be determined based on the patterning of the mask layer 700. In an example, an X dimension of each of the cantilever beams 502-504 along the X axis is determined based a number of transistor pillars between the cantilever beams 501 and 505. A Y dimension of each of the cantilever beams 502-504 along the Y axis is determined based on the size of each transistor pillar. An X dimension of each of the cantilever beams 501 and 505 along the X axis is determined based the size of each supporting pillar, and a Y dimension of each of the cantilever beams 501 and 505 along the Y axis is determined based on a number of the cantilever beams 502-504.

Figure 15:
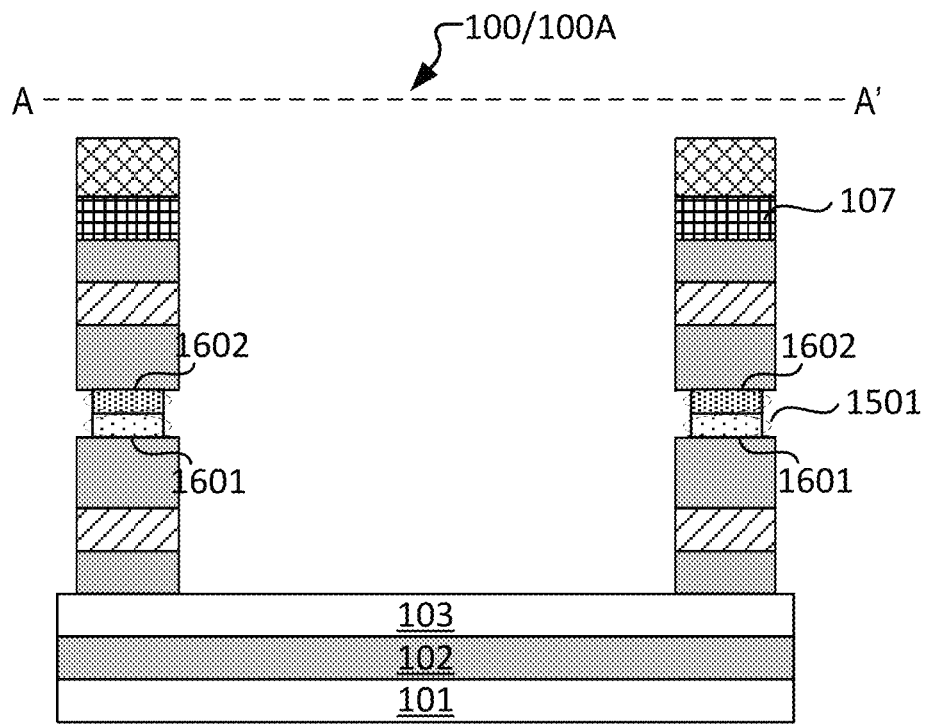
Figure 16:
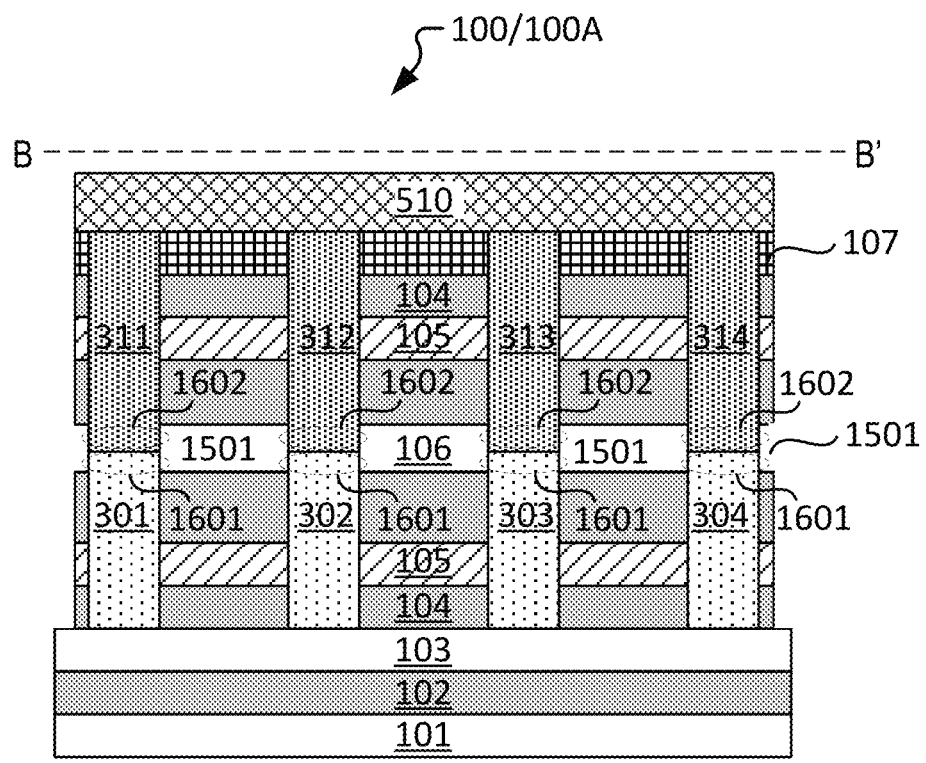
Figure 17:
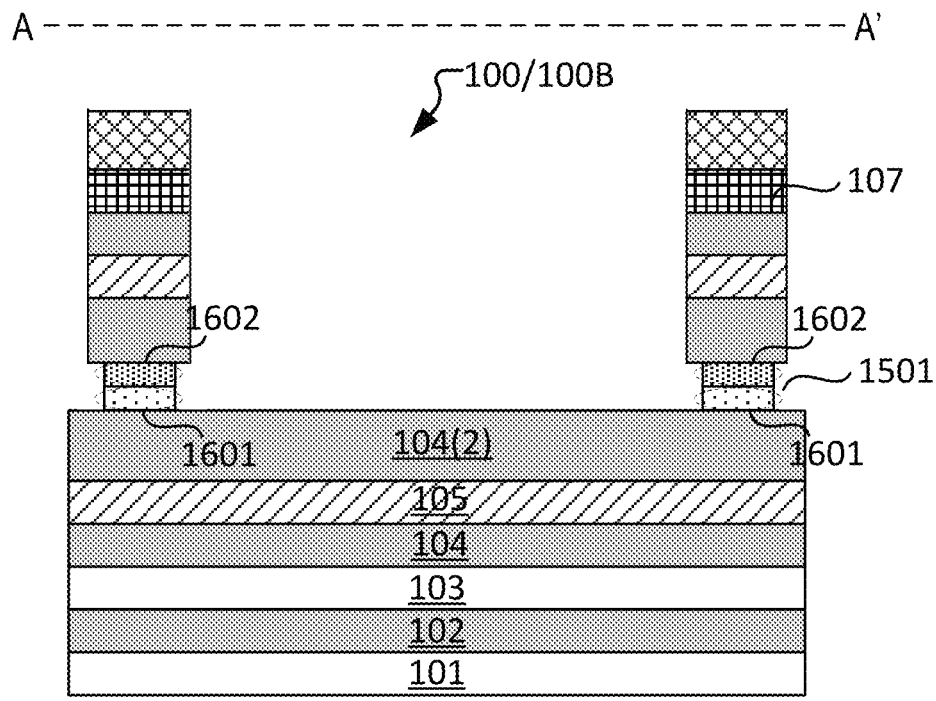
Figure 18:
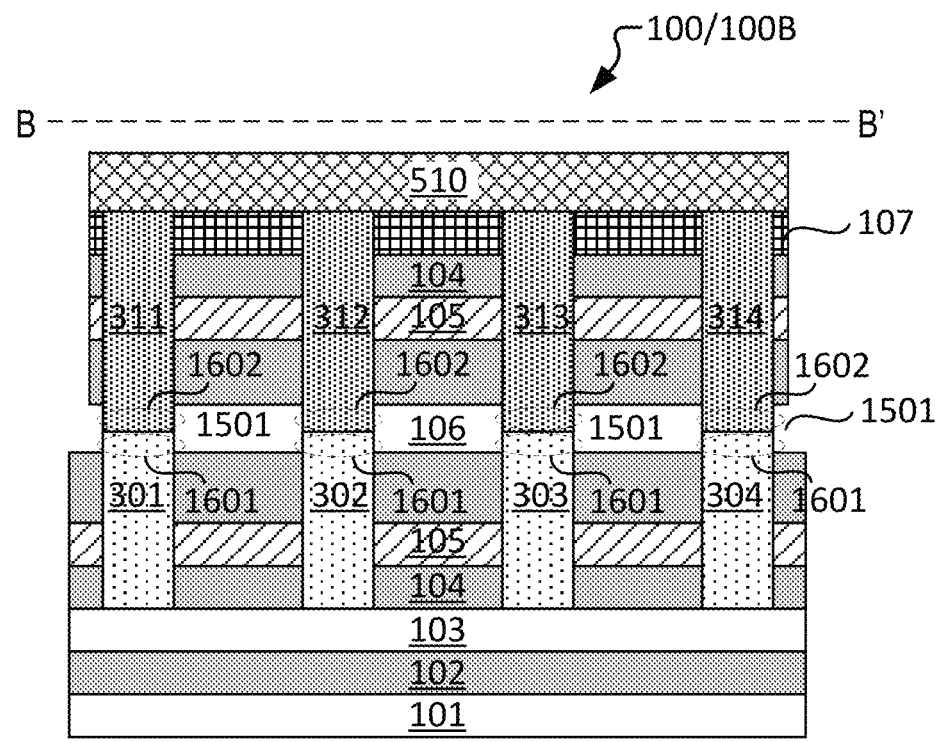

Referring to FIGS. 15-18 and 35A, at 53513, the first dielectric layer 106 can be removed to expose (or uncover) first portions 1601 of the first sub-pillars (e.g., 301-304) and second portions 1602 of the second sub-pillars (e.g., 311-314) in a first open space 1501. FIGS. 15-16 show the cross-sectional views sectioned at AA' and BBs for the etch option A. FIGS. 17-18 show the cross-sectional views sectioned at AA' and BBs for the etch option B.

Figure 19:
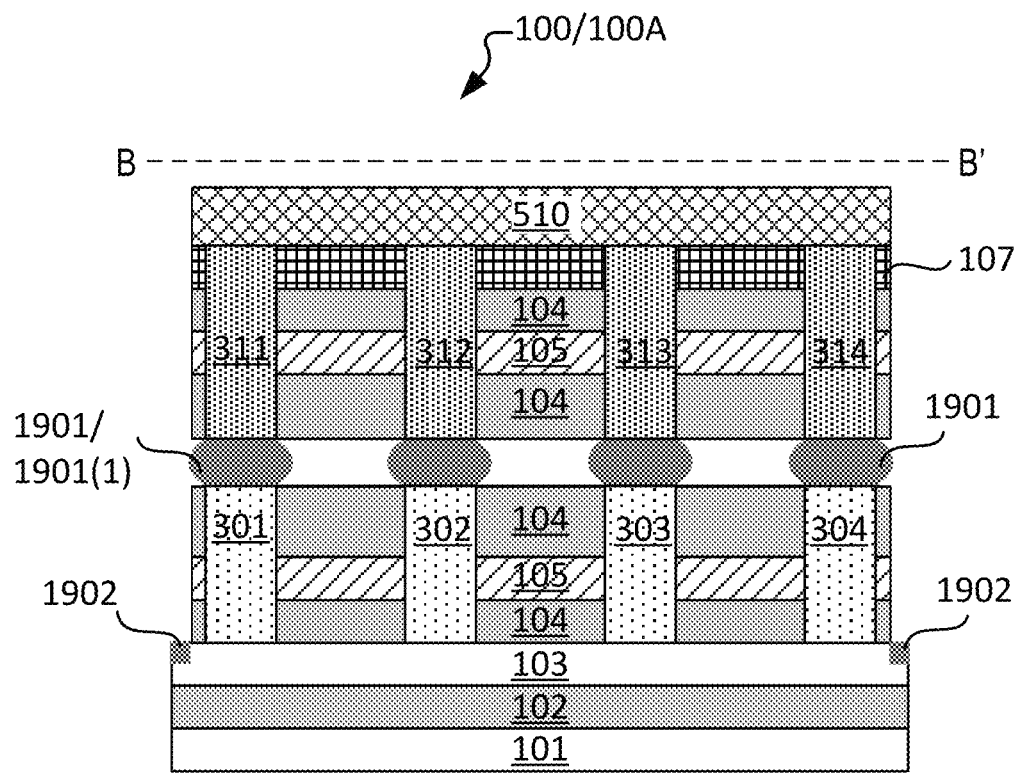
Figure 20:
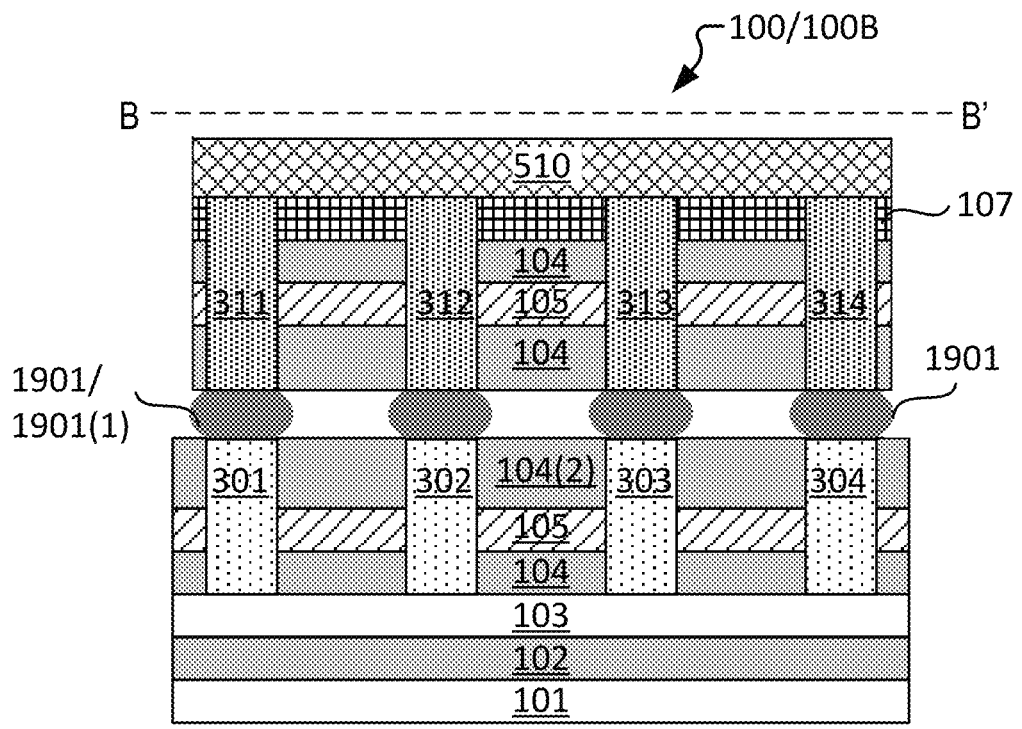
Figure 21:
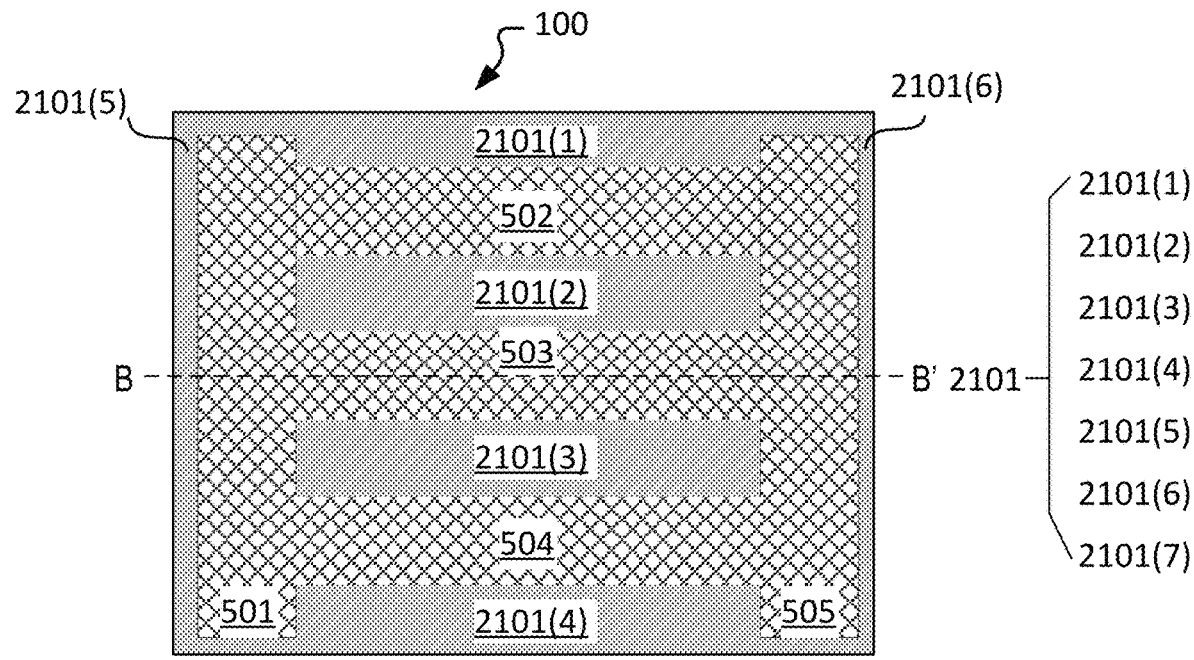

Referring to FIGS. 19-20 and 35B, at 53515, an isolation structure 1901 can be formed between each first sub-pillar (e.g., N+ first sub-pillars) and each respective second sub-pillar (e.g., P+ second sub-pillars) by an isolation process. The isolation structures 1901 can be formed in the first open space 1501. FIG. 19 shows a cross-sectional view sectioned at BB' for the etch option A. FIG. 20 shows a cross-sectional view sectioned at BB' for the etch option B. The isolation process can include oxidation of the first portions 1601 into first oxide structures and the second portions 1602 into second oxide structures where the isolation structures 1901 can include the first oxide structures and the second oxide structures. For example, the isolation structure 1901(1) is formed based on the first portion 1601 of the first sub-pillar 301 and the second portion 1602 of the second sub-pillar 311 where the isolation structure 1901(1) is positioned between the first sub-pillar 301 and the second sub-pillar 311. In an example, the isolation structures 1901 include an oxide material (e.g., silicon oxide).

Referring to FIG. 19, for the etch option A, an isolation layer 1902 can be formed, for example, based on a portion (e.g., an upper portion) of the semiconductor layer 103. The portion of the semiconductor layer 103 can be oxidized to form the isolation layer 1902. The isolation layer 1902 can be silicon oxide. Alternatively, the isolation layer 1902 can reach the dielectric layer 102.

In order to increase the device density of the semiconductor apparatus 100, a plurality of semiconductor devices (e.g., transistors) can be stacked vertically along the Z direction. Thus, referring to FIG. 34, the semiconductor apparatus 100 includes the stacks 2921-2932 of semiconductor devices. Any suitable number of semiconductor devices can be stacked within one of the stacks 2921-2932 of semiconductor devices. In an example, the semiconductor devices (e.g., 2921(1)-(2)) in each stack (e.g., 2921) are formed vertically based on the respective pillar (e.g., 321), and thus are self-aligned. To isolate the 3D semiconductor devices (e.g., 2921(1)-(2)) in each stack (e.g., 2921), the first open space 1501 is formed to expose (or uncover) the first portion 1601 of the first sub-pillar 301 and the second portion 1602 of the second sub-pillar 311 where the first dielectric layer 106 is removed. Subsequently, the isolation structure 1901 is formed by oxidizing the first portion 1601 and the second portion 1602.

To provide process enhancement (e.g., structure stability) for the semiconductor apparatus 100 during the isolation process (e.g., after the removal of the first dielectric layer 106 and prior to filling the first open space 1501 with a portion 2101(7) of a fourth dielectric layer 2101), the cantilever structure 900 can be formed prior to the isolation process to support the 3D semiconductor devices (e.g., 2921(1)-(2)) while the 3D isolation structures 1901 are formed.

As the 3D isolation structures 1901 are formed based on the pillars 321-332, the 3D isolation structures 1901 are self-aligned to the stacks of the 2921-2932 of semiconductor devices. For example, referring to FIGS. 20 and 34, a position (e.g., near the interface 350) of the isolation structure 1901(1) along the Z axis can be determined by the location of the first dielectric layer 106 (or the first open space 1501), and a position (e.g., near the interface 350) of the isolation structure 1901(1) within the XY plane that is perpendicular to the Z axis can be determined by the location of the pillar 321 (or the respective opening 202). Thus, the 3D isolation structures 1901 can be precisely placed at desired locations within the semiconductor apparatus 100 to isolate the vertical GAA transistor (e.g., 2921(1) or 2921(2)) for extreme device scaling application (e.g., at or below 3 nm). The 3D isolation structure 1901(1) is self-aligned to the semiconductor devices 2921(1)-(2) within the stack 2921.

Figure 22:
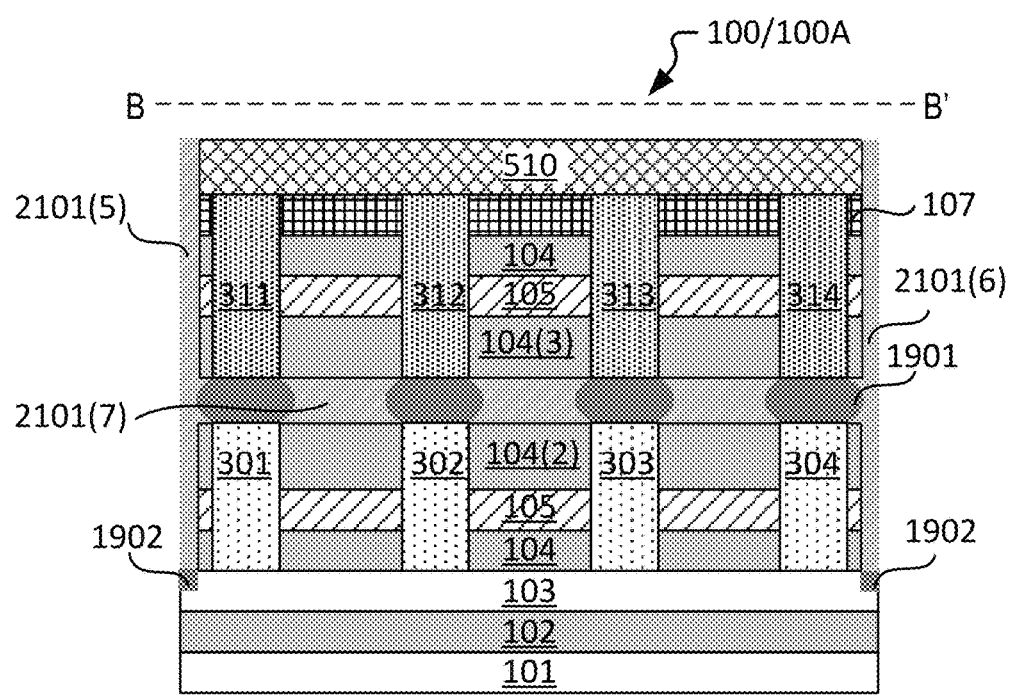
Figure 23:
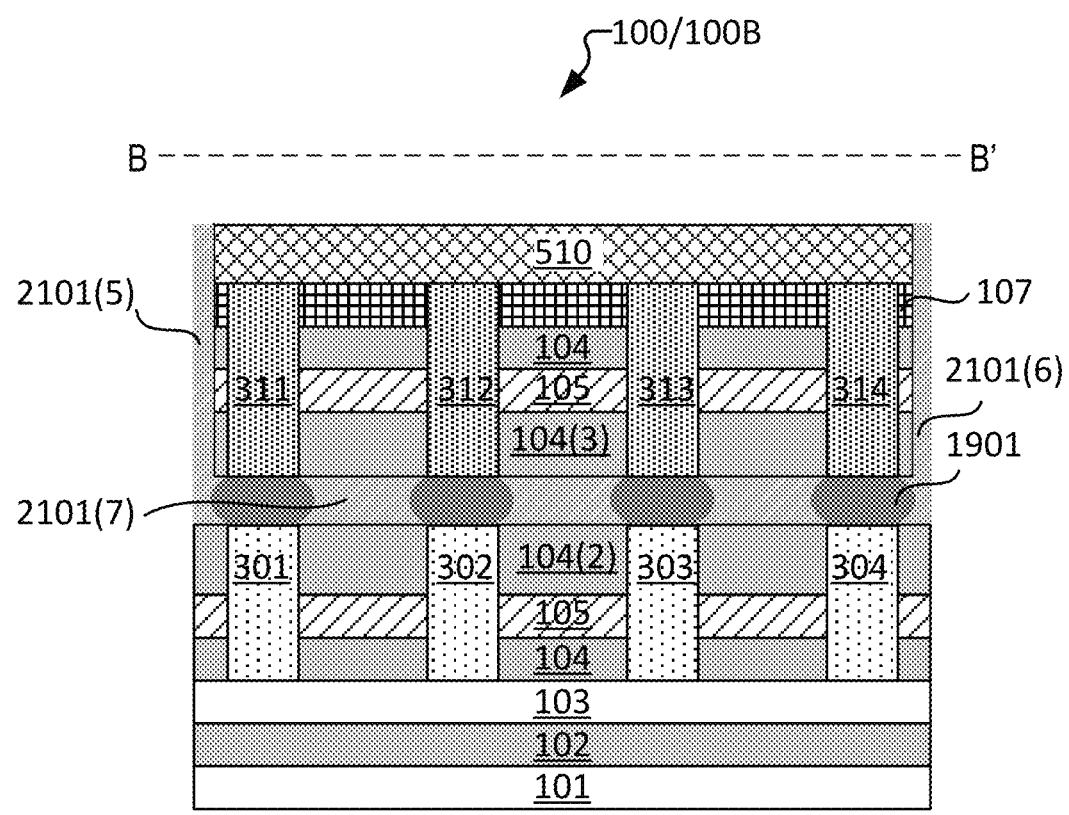

Referring to FIGS. 21-23 and 35B, at S3517, the fourth dielectric layer 2101 (including portions 2101(1)-2101(7)) can be deposited over the stack of dielectric layers 110 and then be planarized by chemical mechanical planarization (CMP). The portion 2101(7) can fill the first open space 1501. Further, the portions 2101(1)-2101(6) can fill the open spaces 911(1)-911(6), respectively. FIG. 22 shows a cross-sectional view sectioned at BB' for the etch option A. FIG. 23 shows a cross-sectional view sectioned at BB' for the etch option B. Referring to FIGS. 22-23, the portion 2101(7) can be positioned between the third dielectric layers 104(2)-104(3). Referring to FIG. 22, for the etch option A, the portions 2101(1)-(6) can be above the isolation layer 1902. Referring to FIG. 23, for the etch option B, the portions 2101(1)-(6) can be above the third dielectric layer 104(2). The fourth dielectric layer 2101 can provide further isolation between semiconductor devices in the semiconductor apparatus 100 and can also provide structural stability.

Figure 24:
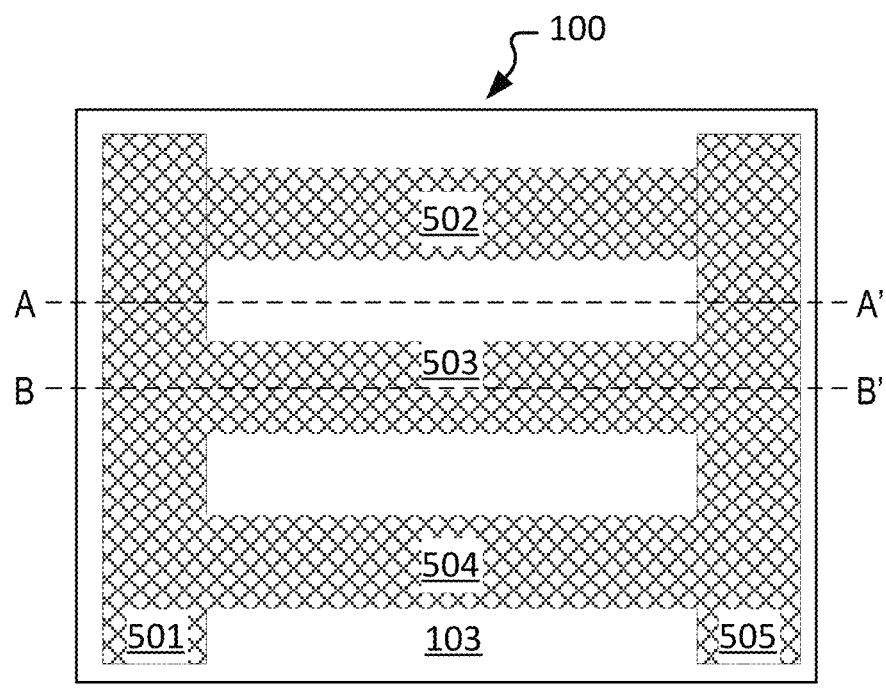
Figure 25:
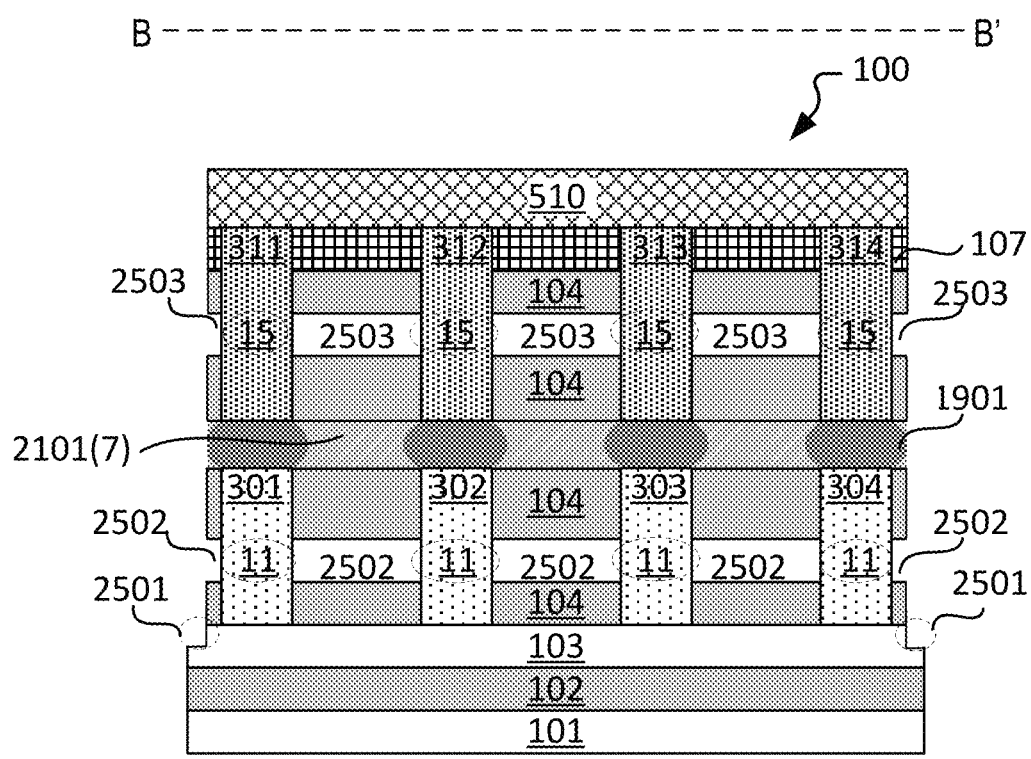

Referring to FIGS. 24-25 and 35B, at S3519, the second dielectric layers 105 can be removed, for example, by the second etching process, to expose (or uncover) third portions 11 the first sub-pillars (e.g., 301-304) in a second open space 2502 and to expose (or uncover) fourth portions 15 of the second sub-pillars (e.g., 311-314) in a third open space 2503. The exposed third portions 11 are the first channel regions 11 of the respective semiconductor devices (e.g., 2921(1)). The exposed fourth portions 15 are the second channel regions 15 of the respective semiconductor devices (e.g., 2921(2)). Thus, respective gate structures 2801 (e.g., first gate structures 2801(1) and second gate structures 2801(2) in FIG. 28) can be subsequently formed over the exposed third portions 11 and the exposed fourth portions 15.

The cantilever structure 900 can provide support to the semiconductor apparatus 100 during the fabrication of the gate structures 2801 (e.g., after the removal of the second dielectric layers 105 and when the second open space 2502 and the third open space 2503 are not filled).

As described above, the first dielectric layer 106, the second dielectric layers 105, and the third dielectric layers 104 can be selective to one another in that one dielectric layer (e.g., one material) can be etched without etching remaining dielectric layers (e.g., remaining materials). Thus, the second etching process can remove the second dielectric layers 105 and does not etch or minimally etch the third dielectric layers 104. In an example, the second etching process etches portions (e.g., 2101(1)-(6)) of the fourth dielectric layer 2101 and the isolation layer 1902. The isolation structures 1901 and the portion 2101(7) of the fourth dielectric layer 2101 are protected by the cantilever beams 501-505 can remain intact or minimally affected.

Referring to FIGS. 22 and 25, for the etch option A, an open space 2501 can be formed after removing the isolation layer 1902. Referring to FIGS. 23 and 25, for the etch option B, in an example, portions of the third dielectric layers 104(1)-104(2) are etched. Further, a top portion of the semiconductor layer 103 can be etched to form the open space 2501, and thus the etch options A and B can have the same structure shown in FIG. 25. Alternatively, the etch option B does not have the open space 2501 shown in FIG. 25.

Referring to FIGS. 26-28 and 35B, at S3521, a gate dielectric layer 2601 (including portions 2601(1)-(3)) and a stack of metal gate layers 2701 (including portions 2701(1)-(3)) can be sequentially formed (e.g., by depositions) over the third portions 11 and the fourth portions 15. Thus, first gate structures 2801(1) can be formed over the exposed third portions 11 of the first sub-pillars (e.g., 301-304) and second gate structures 2801(2) can be formed over the exposed fourth portions 15 of the second sub-pillars (e.g., 311-314). The gate dielectric layer 2601 can include an interface oxide, a high dielectric (or high-K) layer (referred to as the high-K layer), or the like. The portion 2601(1) of the gate dielectric layer 2601 can be referred to as the first gate dielectric layer, and the portion 2601(2) of the gate dielectric layer 2601 can be referred to as the second gate dielectric layer.

Figure 26:
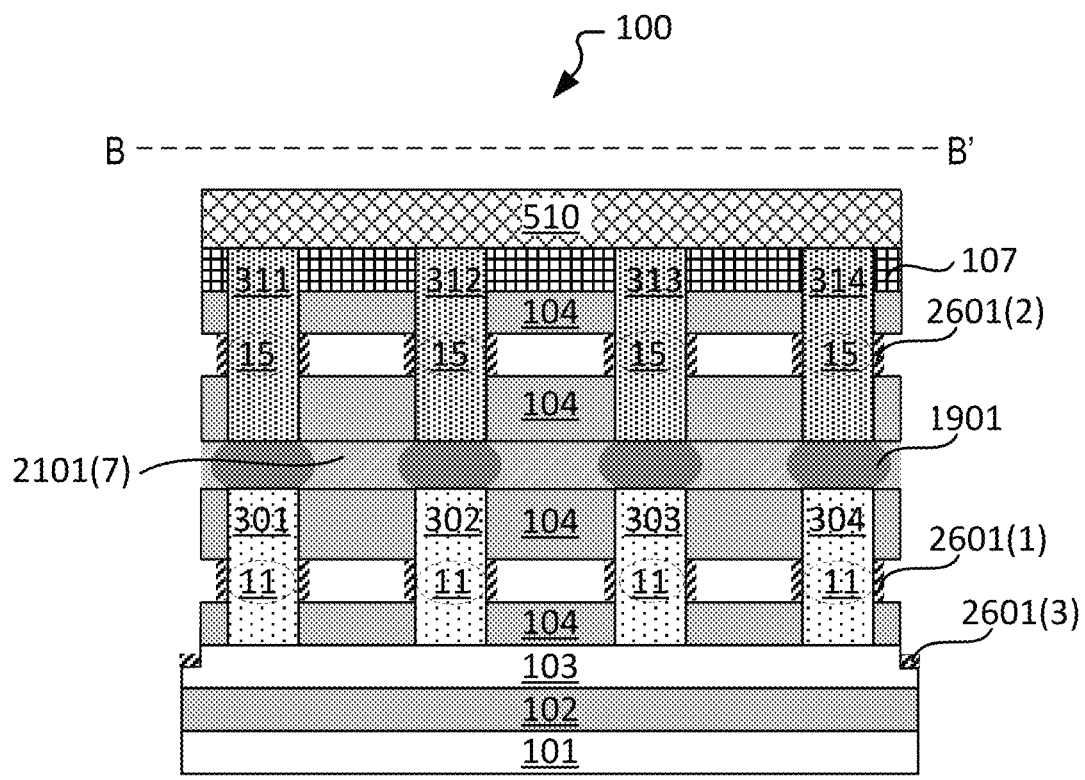

Referring to FIG. 26, in an example, the gate dielectric layer 2601 (including portions 2601(1)-(3)) is selectively deposited over semiconductor material(s) and not over dielectric material(s). Accordingly, the portions 2601(1)-(2) of the gate dielectric layer 2601 (e.g., the high-K layer) can be deposited selectively around the multiple pillars 321-332 (e.g., the exposed third portions 11 and the exposed fourth portions 15), and the portion 2601(3) of the gate dielectric layer 2601 can be deposited selectively over the semiconductor layer 103. Further, the gate dielectric layer 2601 is not deposited or is minimally deposited over the third dielectric layers 104.

Figure 27:
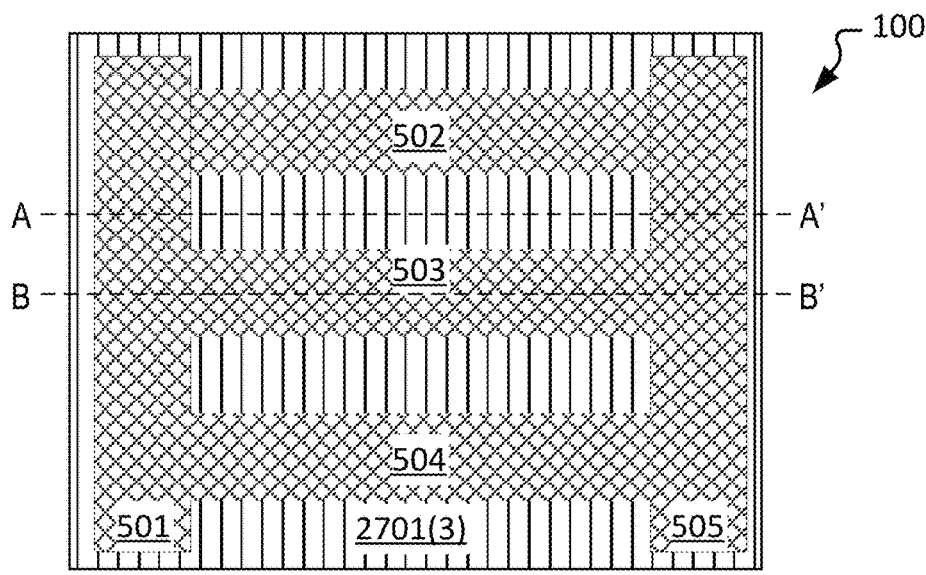
Figure 28:
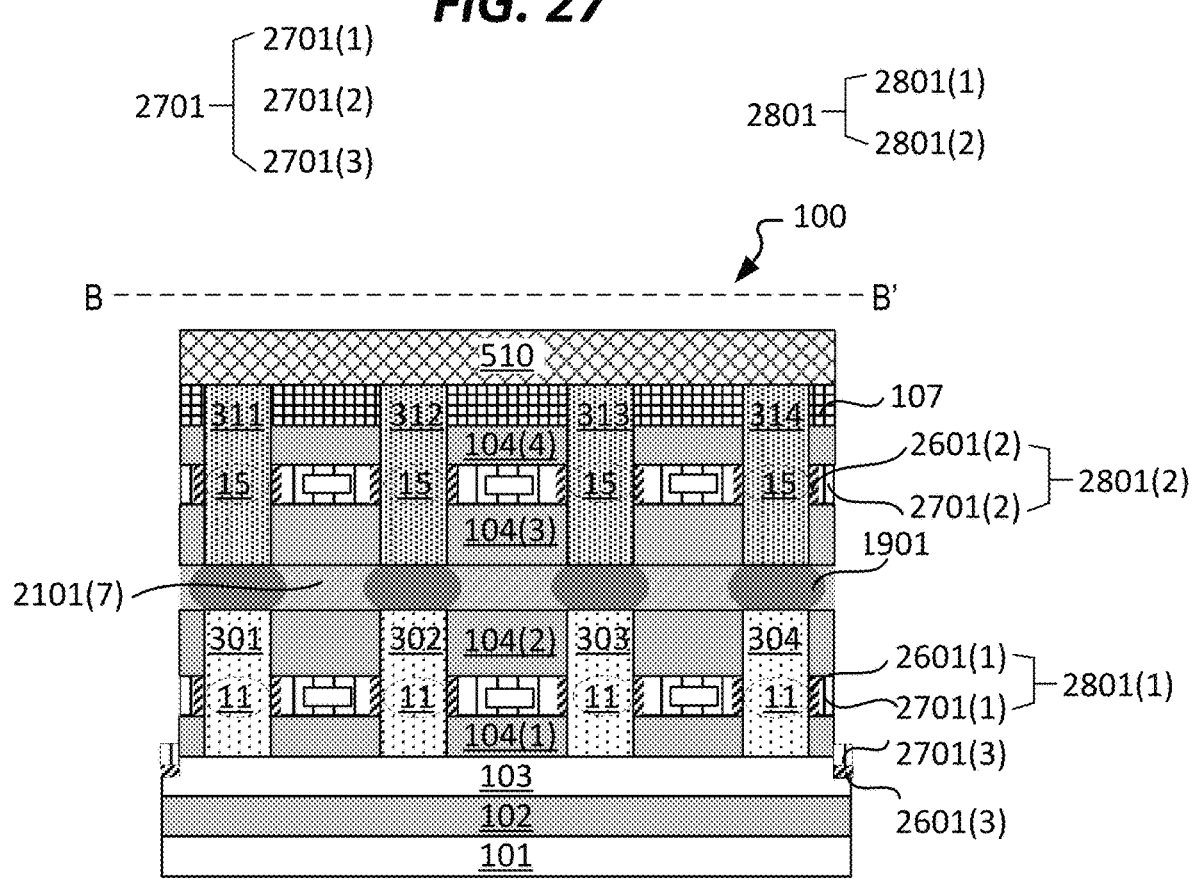

Referring to FIGS. 27-28, the stack of metal gate layers 2701 can be deposited over the gate dielectric layer 2601 and the third dielectric layer 104 (e.g., 104(1)-(4)). The portion 2701(1) of the stack of metal gate layers 2701 can be deposited over the portion 2601(1) of the gate dielectric layer 2601 and the third dielectric layers 104(1)-(2). The portion 2701(2) of the stack of metal gate layers 2701 can be deposited over the portion 2601(2) of the gate dielectric layer 2601 and the third dielectric layers 104(3)-(4). The portion 2701(3) of the stack of metal gate layers 2701 can be deposited over the portion 2601(3) of the gate dielectric layer 2601.

Referring to FIG. 28, the first gate structures 2801(1) can include the portion 2601(1) of the gate dielectric layer 2601 and the portion 2701(1) of the stack of metal gate layers 2701. The exposed third portions 11 are the first channel regions 11 of the respective semiconductor devices (e.g., 2921(1)). The second gate structures 2801(2) can include the portion 2601(2) of the gate dielectric layer 2601 and the portion 2701(2) of the stack of metal gate layers 2701. The exposed fourth portions 15 are the second channel regions 15 of the respective semiconductor devices (e.g., 2921(2)). The first gate structures 2801(1) can fill the second open space 2502 completely or partially. The second gate structures 2801(2) can fill the third open space 2503 completely or partially. The first gate structures 2801(1) can be identical to the second gate structures 2801(2).

Each stack of semiconductor devices can include the self-aligned gate structures (e.g., the first gate structure 2801(1) and the second gate structure 2801(2)), for example, when the gate dielectric layer 2601 is selectively formed over the respective channel regions (e.g., the first channel regions 11 and the second channel regions 15).

Each of the gate structures 2801 (e.g., 2801(1), 2801(2)) can include multiple layers, such as any suitable dielectric layer(s) and conductive layer(s). The conductive layer(s) can include one or more conductive materials, such as polysilicon, copper (Cu), ruthenium (Ru), TiN, TaN, and/or the like. The gate dielectric layer 2601 can include any suitable dielectric material, such as high-K material(s) (e.g., hafnium oxide (HfO), aluminum oxide (AlO)). The stack of metal gate layers 2701 can include any suitable conductive material(s), such as polysilicon, Cu, Ru, TiN, TaN, and/or the like.

Figure 30:
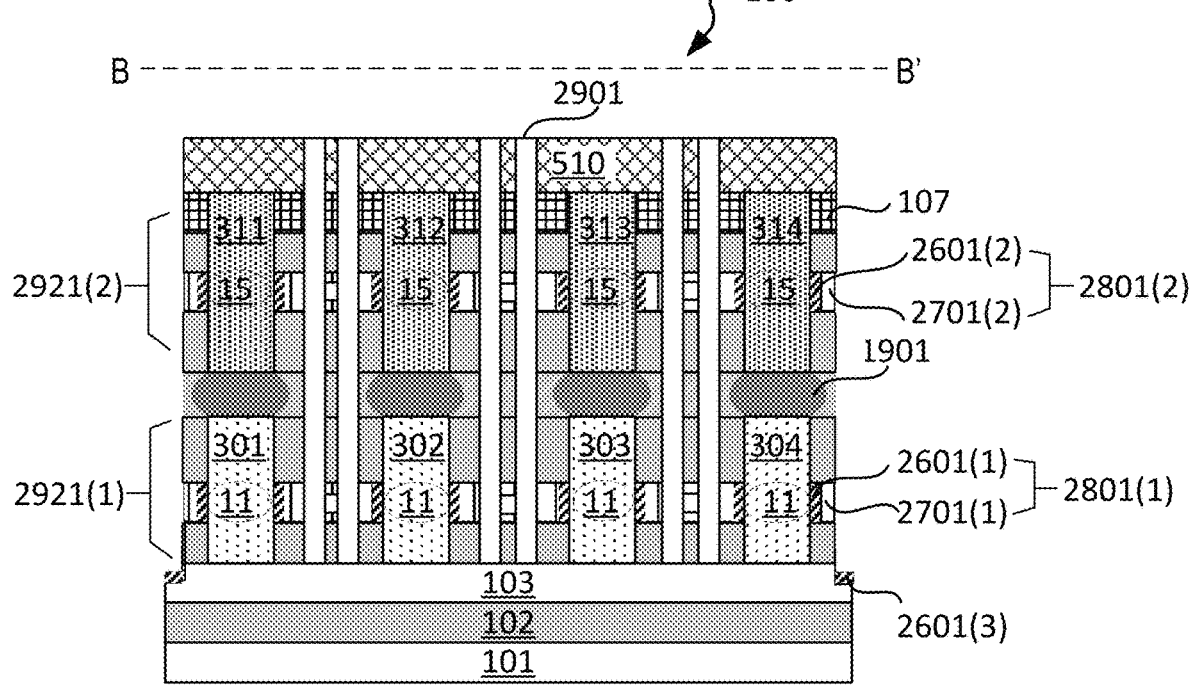

Referring to FIGS. 29-30 and 35B, at S3523, portions of the stack of dielectric layers 110 and portions of the gate structures 2801 (e.g., portions of the stack of metal gate layers 2701) around the multiple pillars 321-332 can be removed to form isolated stacks 2921-2932 of semiconductor devices. In an example, each of the stacks 2921-2932 of semiconductor devices is separated from adjacent stacks of semiconductor devices by trenches 2901.

Each stack of semiconductor devices can include a plurality of semiconductor devices stacked vertically along the Z axis to increase the device density. The plurality of semiconductor devices can be separated by isolation structures (e.g., the isolation structures 1901). For example, the stack 2921 of semiconductor devices includes isolated semiconductor devices 2921(1)-(2) that are separated by the isolation structure 1901. The semiconductor device 2921(1) (also referred to as a first transistor) can include the first channel region 11 and the first gate structure 2801(1). The semiconductor device 2921(2) (also referred to as a second transistor) can include the second channel region 15 and the second gate structure 2801(2).

Figure 31:
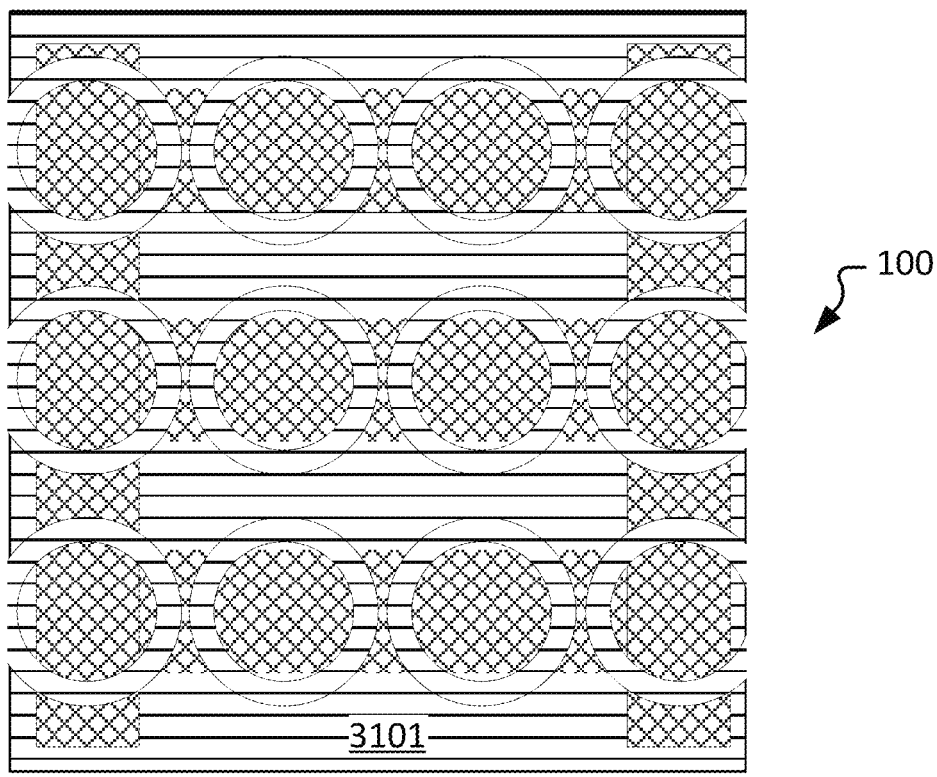
Figure 32:
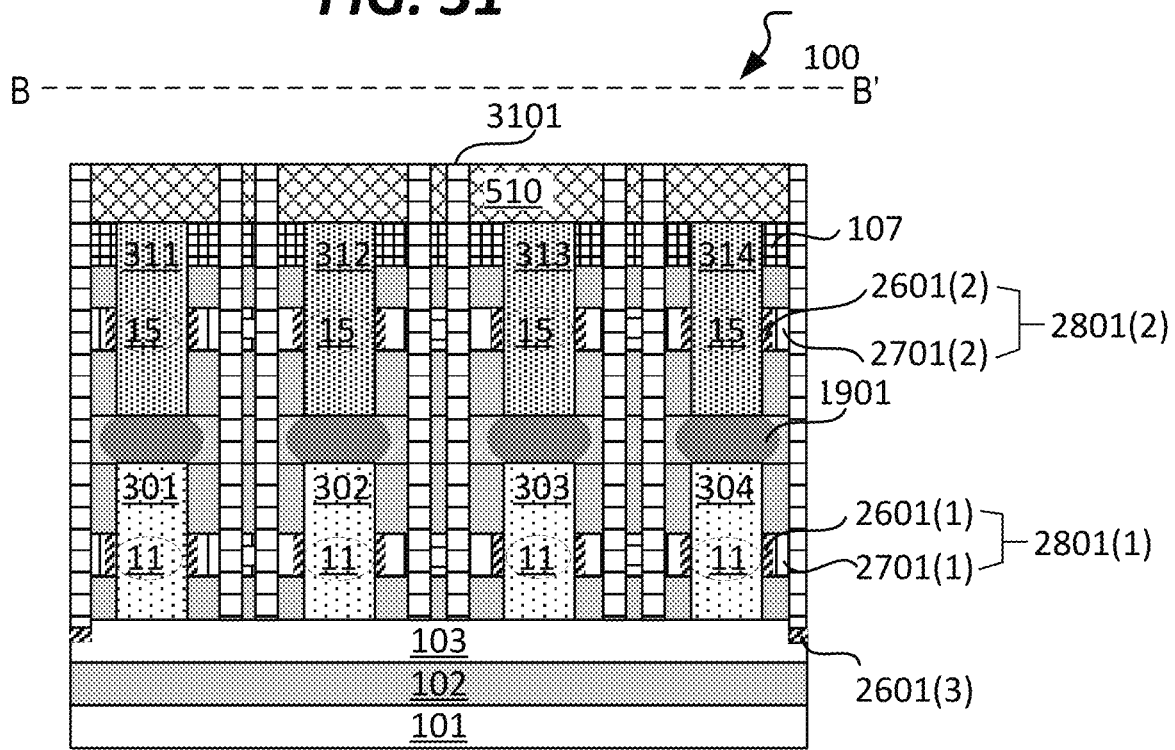

Referring to FIGS. 31-32, a dielectric layer (e.g., including an oxide material) 3101 can be deposited, for example, over the portion 2601(3) of the gate dielectric layer 2601 and inside the trenches 2901. In an example, the trenches 2901 are filled with the dielectric layer 3101. The deposition of the dielectric layer 3101 can be followed by CMP. The dielectric layer 3101 in the trenches 2901 can isolate the stacks 2921-2932 of semiconductor devices.

Figure 33:
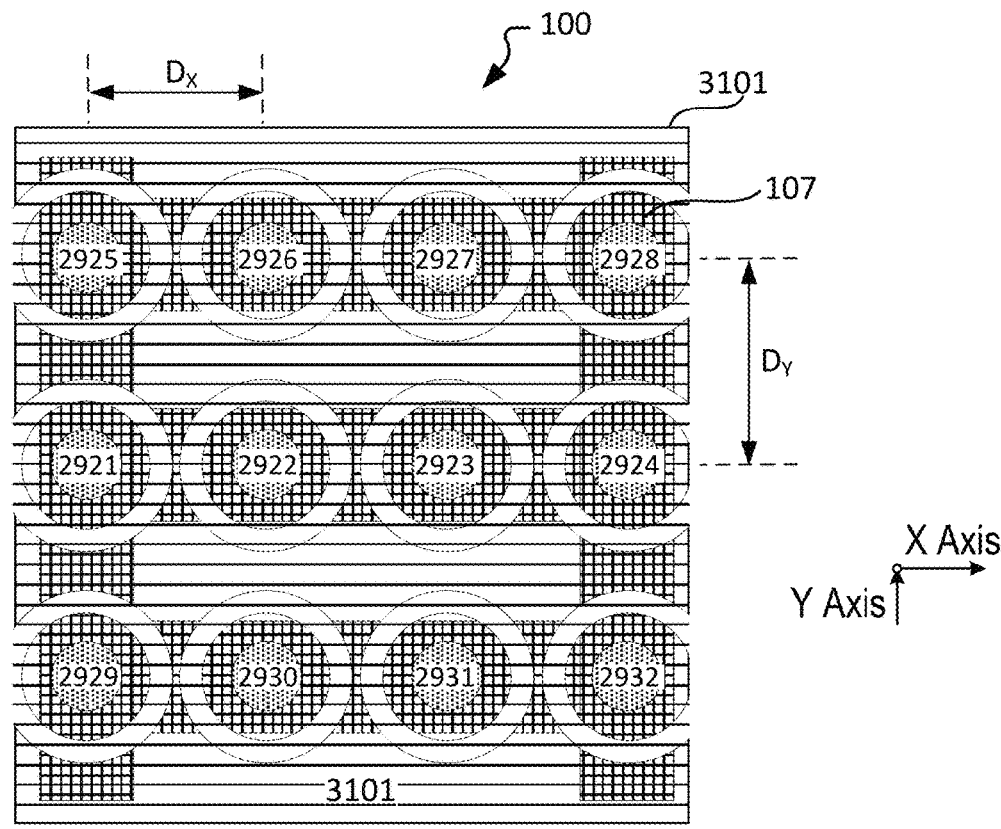

Referring to FIGS. 33-34 and 35B, at S3525, the cantilever layer 510 can be removed. Accordingly, the isolated stacks 2921-2932 of semiconductor devices are formed. Each of the stacks 2921-2932 of semiconductor devices includes two vertically stacked and isolated semiconductor devices. For example, the stack 2921 includes the semiconductor devices 2921(1)-(2). The semiconductor devices 2921(1)-(2) can be vertical flow GAA transistors with a diameter of channel cross sections in the double or single digit nanometer range where the fabrication of the semiconductor devices 2921(1)-(2) is enabled on a nanometer scale using a cantilever solution.

Referring to FIG. 34, in an example, the semiconductor device 2921(1) is an n-type transistor (e.g., a GAA transistor) including first S/D regions (or first S/D terminals) 12-13 and the first channel region (or the first channel structure) 11 formed from the first sub-pillar 301. In an example, the first S/D regions 12-13 and the first channel region 11 are portions of the first sub-pillar 301. The first S/D regions 12-13 and the first channel region 11 can have an identical doping (e.g., P, As). In general, any suitable doping can be used for the first S/D regions 12-13 and the first channel region 11. The doping for the first S/D regions 12-13 can be different from the doping for the first channel region 11. The first channel region 11 can have any suitable structure (including shapes and dimensions) and material systems such that the first channel region 11 can provide a semiconductor channel, such as an n-channel, when the semiconductor device 2921(1) is in operation.

Similarly, the semiconductor device 2921(2) is a p-type transistor (e.g., a GAA transistor) including second S/D regions (or second S/D terminals) 16-17 and the second channel region (or the second channel structure) 15 formed from the second sub-pillar 311. In an example, the second S/D regions 16-17 and the second channel region 15 are portions of the second sub-pillar 311. The second S/D regions 16-17 and the second channel region 15 can have an identical doping (e.g., B). In general, any suitable doping can be used for the second S/D regions 16-17 and the second channel region 15. The doping for the second S/D regions 16-17 can be different from the doping for the second channel region 15. The second channel region 15 can have any suitable structure (including shapes and dimensions) and material systems such that the second channel region 15 can provide a semiconductor channel, such as a p-channel, when the semiconductor device 2921(2) is in operation.

The semiconductor devices 2921-2932 can further include the gate structures 2801 (e.g., the first gate structures 2801(1) and the second gate structures 2801(2)). Each of the gate structures 2801 (e.g., the first gate structures 2801(1) and the second gate structures 2801(2)) can include multiple layers, including any suitable dielectric layer(s) and conductive layer(s) (e.g., metal layer(s)). The conductive layer(s) can include one or more conductive materials, such as polysilicon, Cu, Ru, and/or the like.

The semiconductor devices 2921(1) can include the first gate structures 2801(1) that includes the portion 2601(1) of the gate dielectric layer 2601 and the portion 2701(1) of the stack of metal gate layers 2701. The semiconductor device 2921(2) can include the second gate structure 2801(2) that includes the portion 2601(2) of the gate dielectric layer 2601 and the portion 2701(2) of the stack of metal gate layers 2701. In general, the gate dielectric layer 2601 can include any suitable dielectric material, such as high-K material(s) (e.g., HfO, AlO). The stack of metal gate layers 2701 can include any suitable conductive material(s), such as polysilicon, Cu, Ru, TiN, TaN, and/or the like.

In an example, the semiconductor devices 2921(1) is an NMOS device, and the semiconductor devices 2921(2) is a PMOS device that is electrically and physically isolated from the semiconductor devices 2921(1) via the isolation structure 1901(1). In an example, the semiconductor devices 2921(1) is a PMOS device, and the semiconductor devices 2921(2) is an NMOS device that is electrically and physically isolated from the semiconductor devices 2921(1) via the isolation structure 1901(1).

A distance $D_x$ represents a distance between adjacent stacks of semiconductor devices (e.g., 2925-2926) along the X axis, and a distance $D_Y$ represents a distance between adjacent stacks of semiconductor devices (e.g., 2924 and 2928) along the Y axis. The distances $D_x$ and $D_Y$ can be any suitable distances, for example, determined based on a size, such as a cross-sectional area or a diameter within the XY plane, of each of the stacks 2921-2932 of semiconductor devices. The device density (e.g., a number of semiconductor devices per unit area of the substrate plane) of the semiconductor apparatus 100 can be determined based on the distances $D_x$ and $D_Y$ and a number of semiconductor devices vertically stacked in each of the stacks 2921-2932 of semiconductor devices.

Embodiments and methods in the present disclosure can enable higher density circuits to be produced at a reduced cost. As dimension(s) (e.g., a diameter and/or a cross-sectional area of nano devices) is reduced, for example, to or below a 3 to 5 nm regime, processing of stacked semiconductor devices (e.g., transistors) can be enhanced by placing a disposable upper cantilever structure (e.g., one or more cantilever beams) to support the 3D semiconductor devices while the 3D isolation structures are formed. A disposable upper level cantilever structure can be patterned for specific circuit applications including semiconductor devices of a small scale (e.g., at or smaller than 3 nm). The present disclosure relates to 3D semiconductor devices (e.g., 2921(1)-(2)) to be isolated (e.g., via the isolation structure 1901) vertically using an upper cantilever structure (e.g., including one or more of the cantilever beams 501-505). Any suitable material may be utilized for the cantilever structure. In an example, nitride (e.g., silicon nitride, germanium nitride) is used as the cantilever structure material. A cantilever structure may be applied to fabricate any region (e.g., a gate structure, S/D terminal, and/or the like) of a transistor, for example, that needs support due to a small feature size. In an example shown in the disclosure, the gate structure (or the gate electrode) is formed with the cantilever support. As described above, a cantilever (e.g., one of the cantilever beams 502-505) can be applied to any suitable number (e.g., 50 to 100) of vertical stacks of semiconductor devices, and thus any suitable number of vertical stacks of semiconductor devices can be placed between cantilever supporting rails (e.g., the cantilever rails 501 and 505).

The multiple pillars 321-332 can be grown vertically via, for example, epitaxy growth and can be self-aligned to the precise dielectric stack 110 and thus allowing the 3D isolation structures to be precisely placed at desired locations to isolate each vertical GAA transistor (e.g., 2921(1)) for extreme device scaling application (e.g., at or below 3 nm).

Embodiments of the disclosure relate to formation of the 3D isolation structures and 3D gate electrodes integrated together using a cantilever structure for vertical stacked 3D semiconductor devices. Multiple stacks of semiconductor devices (e.g., PMOS devices, NMOS devices or suitable device elements) can be formed with isolation, and thus achieving an increased circuit density with a cantilever structure. The process flow 3500 includes formation of a disposable cantilever (e.g., the cantilever beams 501-505), the 3D isolation integrated with the 3D gate structure (or a 3D gate electrode, e.g., the gate structures 2801) formation of the plurality of vertical GAA transistors (e.g., 2921(1)-(2)). The plurality of vertical GAA transistors (or the stacks of semiconductor devices 2921-2932) can have an epitaxy doing of N+ or P+Si or Ge. In an example, each stack of semiconductor devices can be separated by a self-aligned dielectric isolation structure or layer (e.g., the isolation structure 1901). Each stack of semiconductor devices can include self-aligned gate structures or gate electrode regions (e.g., the first gate structure 2801(1) and the second gate structure 2801(2)).

The process flow 3500 can be implemented, for example, using the etch option A where the cantilever support is etched down to the semiconductor layer 103 and the etch option B where the cantilever support is etched down to the top surface of the third dielectric layer 104(2) that is adjacent to the future oxidation region 1501.

The process flow 3500 can be suitably adapted based on circuit and device requirements. FIGS. 1-34 show twelve stacks of semiconductor devices (e.g., 2921-2932) arranged in three rows and four columns in the XY plane. Each row includes two transistor pillars (e.g., 322-323) and two supporting pillars (e.g., 321 and 324). The semiconductor apparatus 100 can include any suitable number of stacks of semiconductor devices that are distributed in any suitable arrangement. For example, each row can include any suitable number of pillars, such as 50-100 transistor pillars. Thus, the cantilever structure used to support the semiconductor apparatus 100 during the fabrication process can include a cantilever that is configured to support the number of pillars in each row. The cantilever can further be connected via one or more cantilever rails to respective one or more cantilever supporting structures.

In the example shown in FIGS. 1-34, each of the stacks 2921-2932 of semiconductor devices includes two vertically stacked semiconductor devices (e.g., 2921(1)-(2)). The descriptions and the process flow 3500 can be suitably adapted to stacks of semiconductor devices including more than two vertically stacked semiconductor devices. For example, referring back to FIG. 1, additional first dielectric layer(s) 106, second dielectric layers 105, and third dielectric layers 104 can be formed between the hard mask layer 107 and the third dielectric layer 104(4). Other steps can be adapted accordingly to manufacture the two semiconductor devices simultaneously with additional semiconductor device(s) stacked above the two semiconductor devices, and thus the entire stack of semiconductor devices are self-aligned, as described above. As described above, when the number of semiconductor devices in each stack increases, the cantilever structure can be adapted to better support the semiconductor apparatus 100, for example, the cantilever beams can have larger cross-sectional areas and/or larger thicknesses, can include materials having greater strength, and/or the like.

In general, a semiconductor apparatus, such as the semiconductor apparatus 100 can include transistors (e.g., an n-type MOS device, a p-type MOS device, FETs and floating-gate transistors), integrated circuits, a semiconductor chip (e.g., memory chip including a 3D NAND memory device, a logic chip on a semiconductor die), a stack of semiconductor chips, a semiconductor package, a semiconductor wafer, a die, and/or the like.

In the manufacture of a semiconductor apparatus (e.g., on a microscopic scale), various fabrication processes can be implemented. The fabrication processes can include film-forming depositions, etch mask creation, patterning, material etching and removal, doping treatments, and/or the like. The fabrication processes can be performed repeatedly to form desired semiconductor device elements or components on a substrate of the semiconductor apparatus.

The embodiments can be suitably adapted to a 3D semiconductor apparatus that can include additional 3D devices, such as a stacked SRAM as well as for other transistor types.

An order of description of different embodiments or steps in the present disclosure is presented for clarity sake. In general, the embodiments or steps can be performed in any suitable order. Additionally, although each of the embodiments, such as different features, techniques, configurations, and/or the like may be described in different places of the present disclosure, it is intended that each of the embodiments can be executed independently of each other or in combination with each other. Accordingly, the present disclosure can be embodied and viewed in many different ways.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method of forming a semiconductor apparatus, comprising:
    forming a stack of dielectric layers over a semiconductor layer on a substrate of the semiconductor apparatus;
    forming multiple openings in the stack of dielectric layers, the multiple openings uncovering the semiconductor layer and extending along a Z direction that is substantially perpendicular to the substrate;
    forming multiple pillars in the multiple openings, the multiple pillars including first sub-pillars made of a first semiconductor material and second sub-pillars made of a second semiconductor material, the first sub-pillars and the second sub-pillars being separated by an interface in one of the stack of dielectric layers;
    forming a cantilever structure that includes a first cantilever beam and a second cantilever beam, the first cantilever beam and the second cantilever beam being portions of a cantilever dielectric layer over the stack of dielectric layers;
    forming a cantilever supporting structure that includes a portion of a first subset of the multiple pillars, the cantilever supporting structure being formed based at least on the first cantilever beam and extending from the first cantilever beam down to a first depth in the stack of dielectric layers, the first depth being at least below the one of the stack of dielectric layers, the first cantilever beam connecting the second cantilever beam and the cantilever supporting structure;
    removing the one of the stack of dielectric layers to uncover first portions of the first sub-pillars and second portions of the second sub-pillars; and
    forming isolation structures between the first sub-pillars and the respective second sub-pillars.

2. The method of claim 1, wherein the stack of dielectric layers comprises one or more first dielectric layers having a first dielectric material, second dielectric layers having a second dielectric material, and third dielectric layers having a third dielectric material, the one or more first dielectric layers including the one of the stack of dielectric layers.

3. The method of claim 2, wherein the first dielectric material, the second dielectric material, and the third dielectric material are different from each other.

4. The method of claim 2, wherein
    the first depth corresponds to the semiconductor layer; and
    the cantilever supporting structure extends down to the semiconductor layer.

5. The method of claim 2, wherein
    the first depth corresponds to a lower surface of the one of the stack of dielectric layers; and
    the cantilever supporting structure extends down to the lower surface of the one of the stack of dielectric layers.

6. The method of claim 1, wherein forming the isolation structures further comprises:
   oxidizing the first portions of the first sub-pillars into first oxide structures; and
   oxidizing the second portions of the second sub-pillars into second oxide structures, the isolation structures including the first oxide structures and the second oxide structures.

7. The method of claim 2, further comprising:
   removing the second dielectric layers to expose third portions of the first sub-pillars and fourth portions of the second sub-pillars;
   forming first gate structures over the third portions of the first sub-pillars; and
   forming second gate structures over the fourth portions of the second sub-pillars.

8. The method of claim 7, wherein
   forming the first gate structures includes:
      forming a first gate dielectric layer over the third portions of the first sub-pillars; and
      forming a first metal layer over the first gate dielectric layer; and
   forming the second gate structures includes:
      forming a second gate dielectric layer over the fourth portions of the second sub-pillars; and
      forming a second metal layer over the second gate dielectric layer.

9. The method of claim 8, wherein
   forming the first gate dielectric layer includes selectively forming a first high dielectric (high-K) layer over the third portions of the first sub-pillars, the first high-K layer not being formed over the third dielectric layers, the first gate dielectric layer being the first high-K layer; and
   forming the second gate dielectric layer includes selectively forming a second high-K layer over the fourth portions of the second sub-pillars, the second high-K layer not being formed over the third dielectric layers, the second gate dielectric layer being the second high-K layer.

10. The method of claim 8, wherein the first gate dielectric layer and the second gate dielectric layer include an interface oxide.

11. The method of claim 7, wherein the first gate structures are identical to the second gate structures.

12. The method of claim 1, wherein
   the first cantilever beam is directly above the first subset of the multiple pillars; and
   the second cantilever beam is directly above a second subset of the multiple pillars.

13. The method of claim 12, wherein the first cantilever beam is substantially perpendicular to the second cantilever beam.

14. The method of claim 12, wherein
   the cantilever structure further includes a third cantilever beam that is substantially parallel to the first cantilever beam and is connected to the second cantilever beam, the third cantilever beam being a portion of the cantilever dielectric layer; and
   the cantilever supporting structure further includes a portion of a third subset of the multiple pillars, the cantilever supporting structure being formed based on the first cantilever beam and the third cantilever beam.

15. The method of claim 7, further comprising:
   removing portions of the stack of dielectric layers, portions of the first gate structures, and portions of the second gate structures that are between adjacent ones of the multiple pillars to form trenches that isolate stacks of semiconductor devices, each of the isolated stacks of semiconductor devices including a first device and a second device that is stacked above the first device, the first device being formed based on one of the third portions and the respective first gate structure, the second device being formed based on one of the fourth portions and the respective second gate structure.

16. The method of claim 15, wherein the one of the third portions corresponds to a first channel region of the first device, and the one of the fourth portions corresponds to a second channel region of the second device.

17. The method of claim 15, further comprising removing the cantilever structure over the stack of dielectric layers.

18. The method of claim 15, further comprising depositing a dielectric layer to fill the trenches.

19. The method of claim 15, wherein
   the first device is one of an n-type metal-oxide semiconductor (MOS) (NMOS) device and a p-type MOS (PMOS) device; and
   the second device is another one of the NMOS device and the PMOS device, the second device being isolated from the first device by one of the isolation structures.

20. The method of claim 18, wherein one of the stacks of semiconductor devices is isolated from adjacent stacks of semiconductor devices by the trenches filled with the dielectric layer.

* * * * *